(12) United States Patent
Miyazaki

(10) Patent No.: US 9,691,777 B2
(45) Date of Patent: Jun. 27, 2017

(54) NON-VOLATILE SEMICONDUCTOR MEMORY DEVICE

(71) Applicant: KABUSHIKI KAISHA TOSHIBA, Tokyo (JP)

(72) Inventor: Shoichi Miyazaki, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 104 days.

(21) Appl. No.: 14/614,586

(22) Filed: Feb. 5, 2015

(65) Prior Publication Data
US 2015/0263019 A1 Sep. 17, 2015

Related U.S. Application Data

(60) Provisional application No. 61/951,346, filed on Mar. 11, 2014.

(51) Int. Cl.
| | |
|---|---|
| *H01L 27/15* | (2006.01) |
| *H01L 27/11524* | (2017.01) |
| *H01L 29/66* | (2006.01) |
| *H01L 27/11529* | (2017.01) |
| *H01L 29/788* | (2006.01) |
| *H01L 21/28* | (2006.01) |
| *H01L 29/423* | (2006.01) |

(52) U.S. Cl.
CPC .. *H01L 27/11524* (2013.01); *H01L 21/28282* (2013.01); *H01L 27/11529* (2013.01); *H01L 29/42324* (2013.01); *H01L 29/66825* (2013.01); *H01L 29/788* (2013.01)

(58) Field of Classification Search
None
See application file for complete search history.

(56) References Cited

U.S. PATENT DOCUMENTS

| | | | |
|---|---|---|---|
| 6,927,449 B2 * | 8/2005 | Matsui | H01L 27/105 257/316 |
| 7,781,822 B2 | 8/2010 | Kamigaichi et al. | |
| 8,502,295 B2 | 8/2013 | Kim | |
| 2004/0175924 A1 * | 9/2004 | Choi | H01G 4/228 438/622 |
| 2006/0231822 A1 * | 10/2006 | Kim | H01L 27/115 257/1 |
| 2008/0191283 A1 | 8/2008 | Shin | |
| 2011/0217817 A1 * | 9/2011 | Kim | H01L 21/28 438/238 |

* cited by examiner

*Primary Examiner* — Ermias Woldegeorgis
(74) *Attorney, Agent, or Firm* — Patterson & Sheridan, LLP

(57) ABSTRACT

A semiconductor memory device includes a semiconductor substrate, a first insulating film disposed on the semiconductor substrate, a first conductive film disposed on the first insulating film, a second insulating film disposed on the first conductive film, a second conductive film disposed on the second insulating film, a first electrode disposed on the first conductive film through an opening formed in the second conductive film and the second insulating film, and having a first width, a second electrode that is formed on the first electrode and having a second width, and a wiring layer that is formed on the second electrode. A first width of the first electrode is wider than a second width of the second electrode.

16 Claims, 46 Drawing Sheets

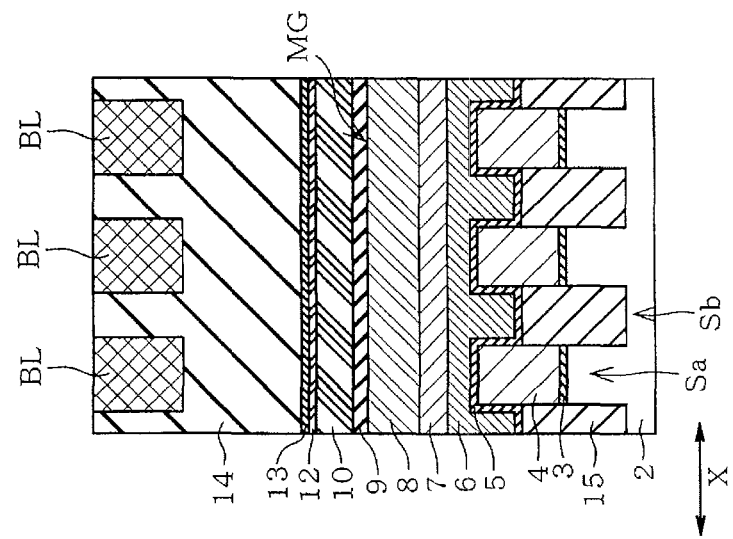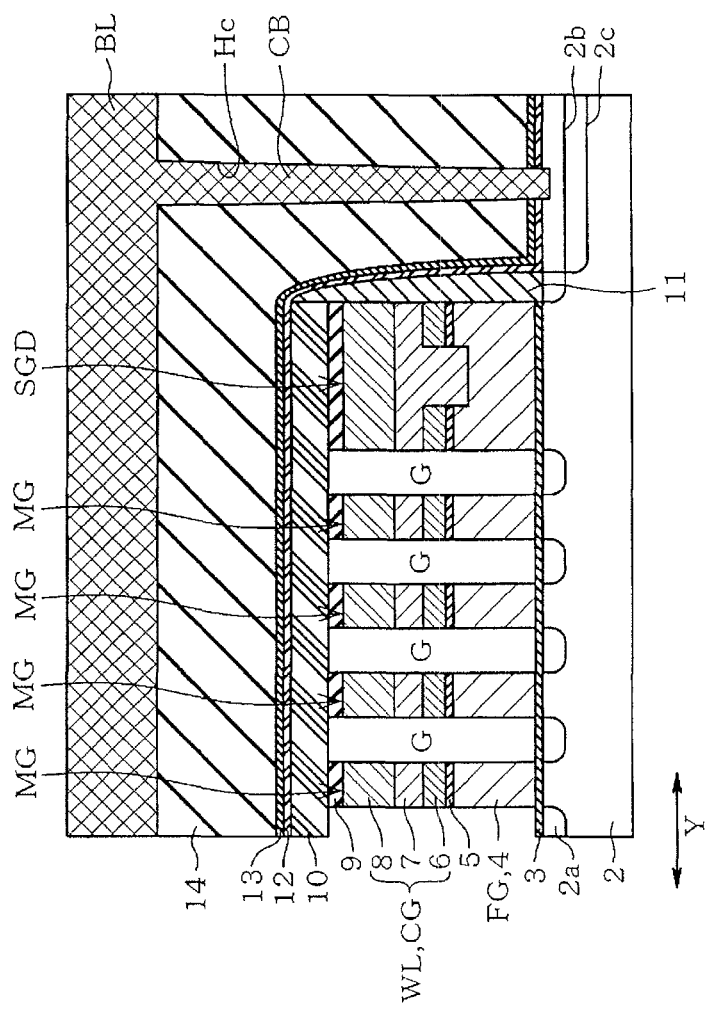

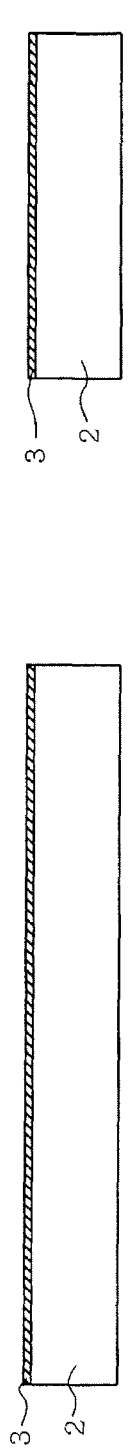
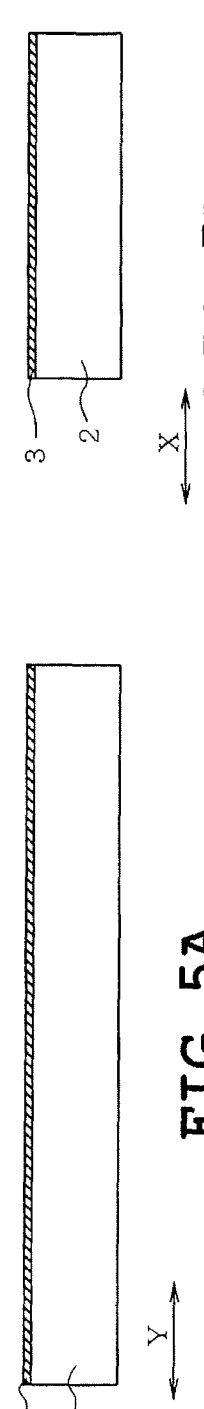
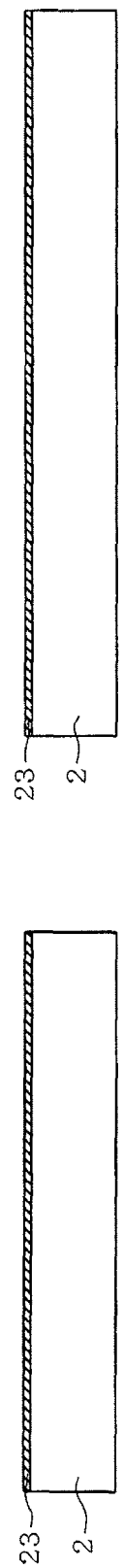
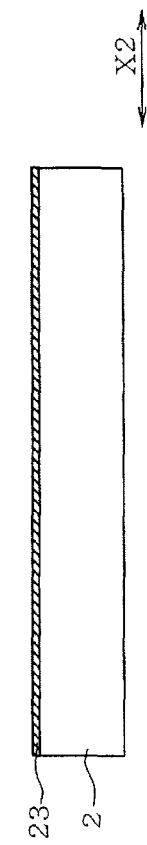

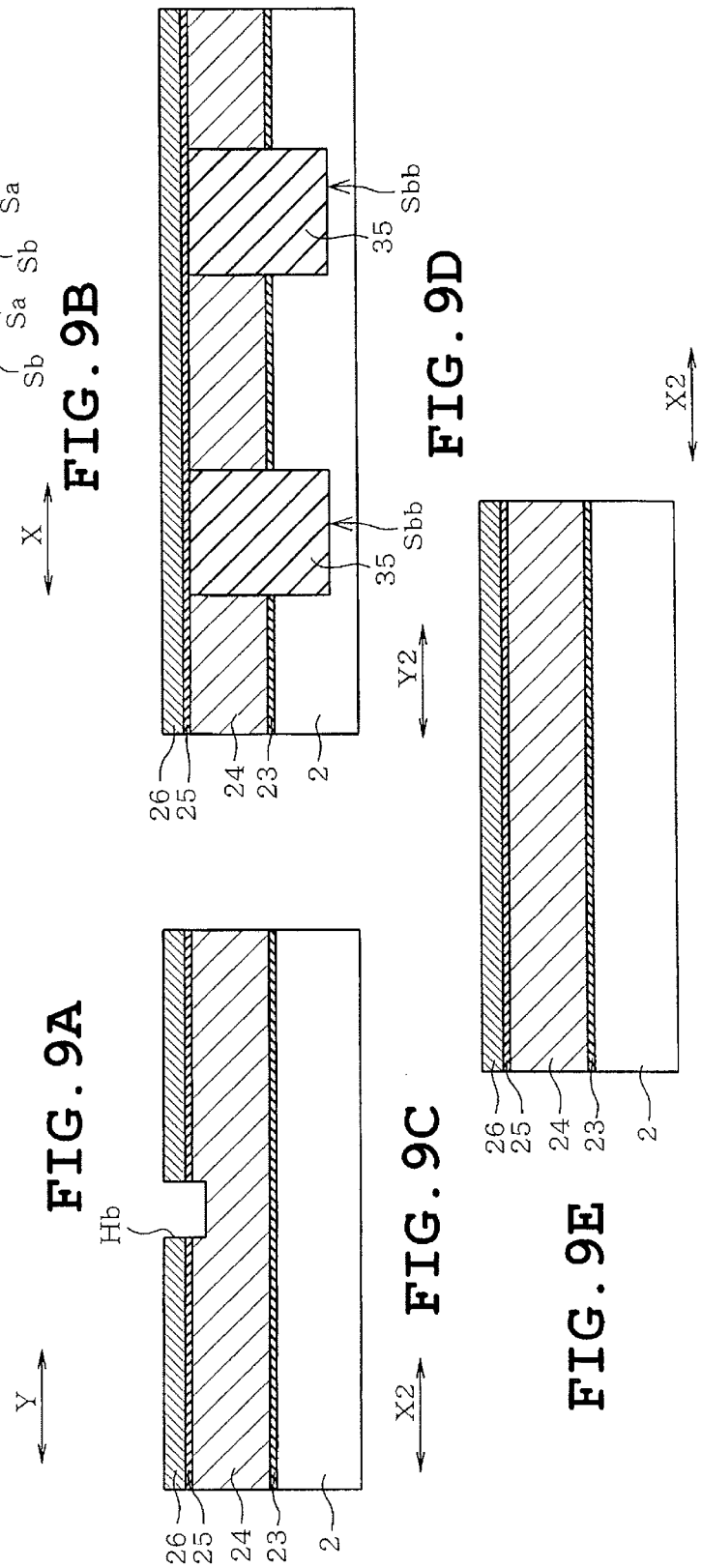

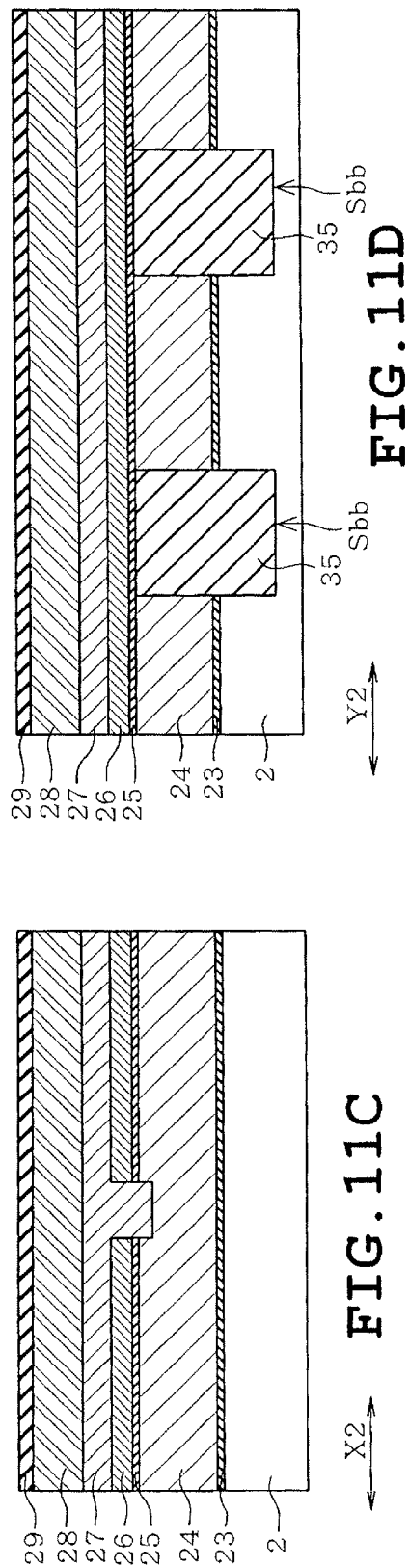
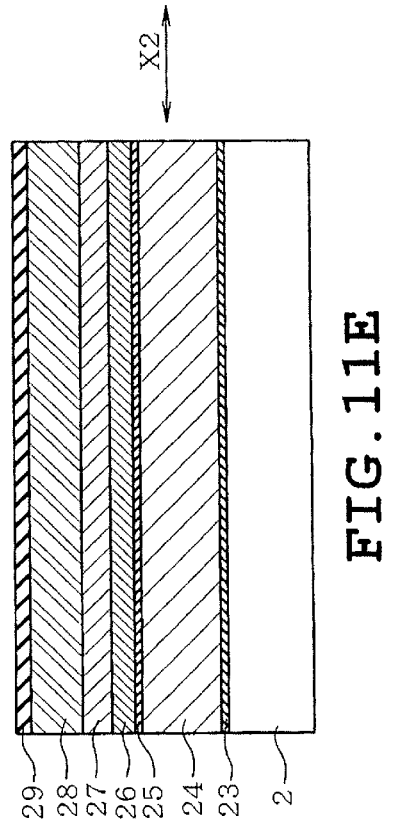

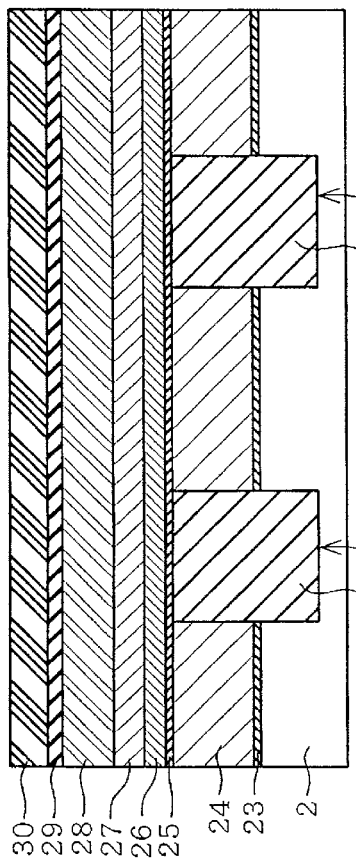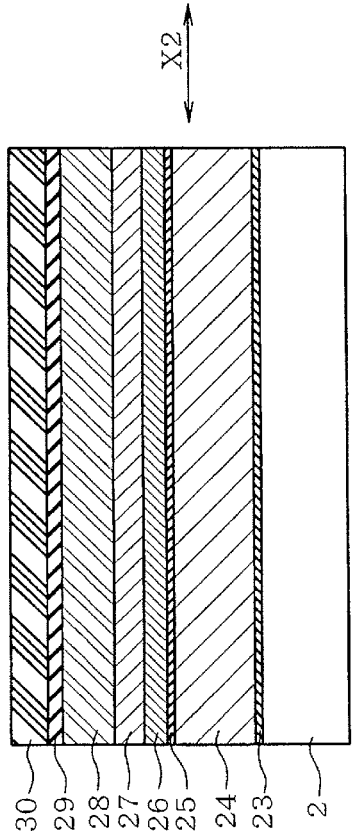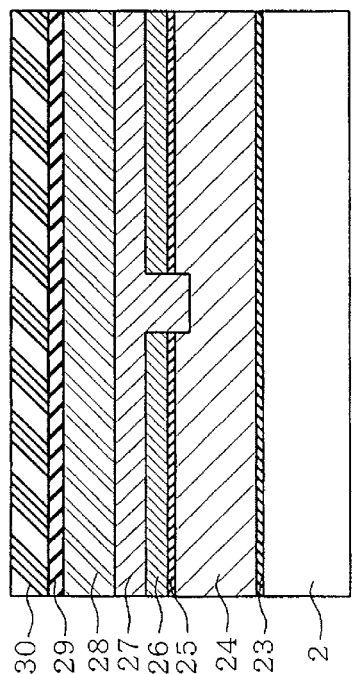
FIG. 12C
FIG. 12D
FIG. 12E

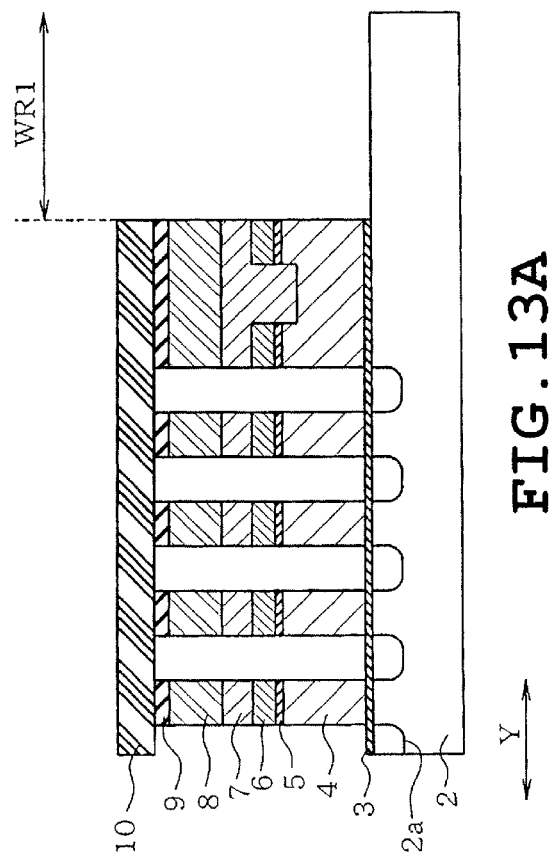
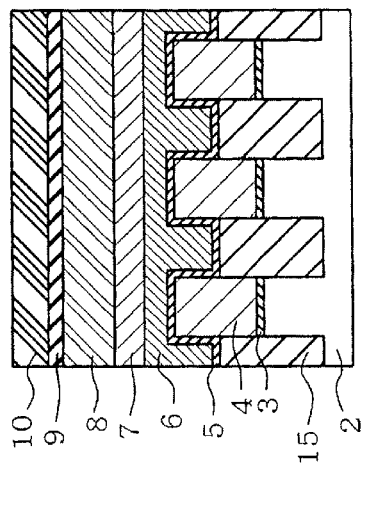
FIG. 13A
FIG. 13B

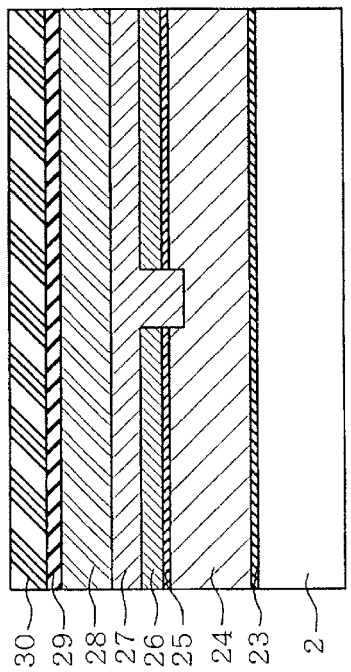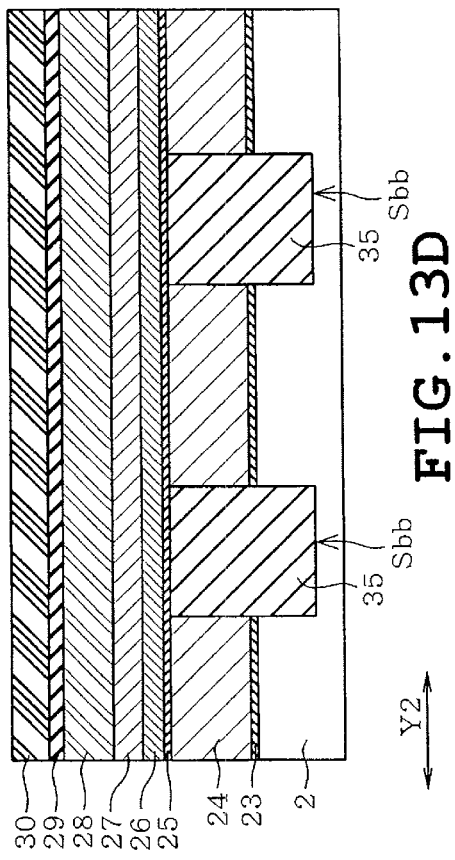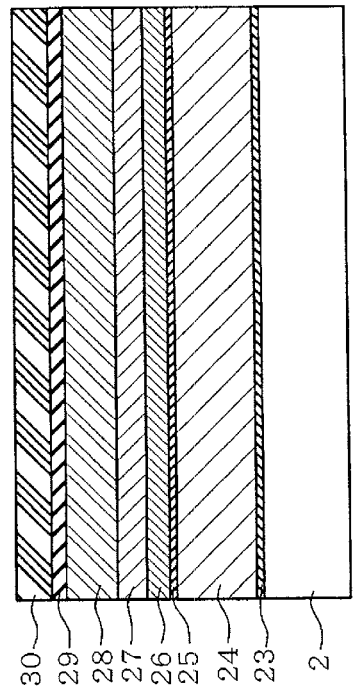
FIG. 13C
FIG. 13D
FIG. 13E

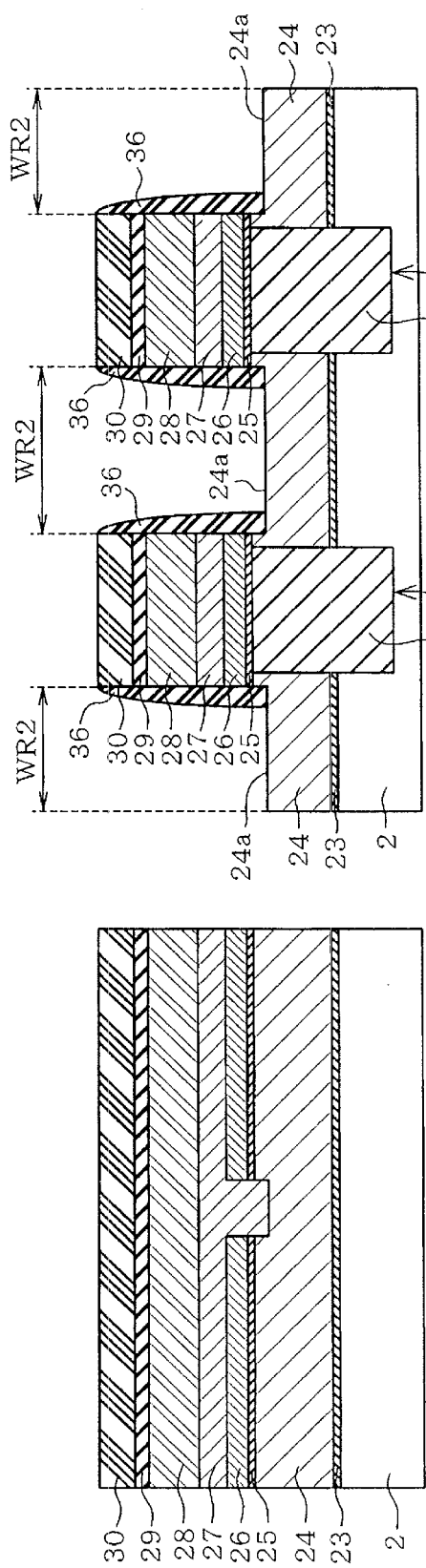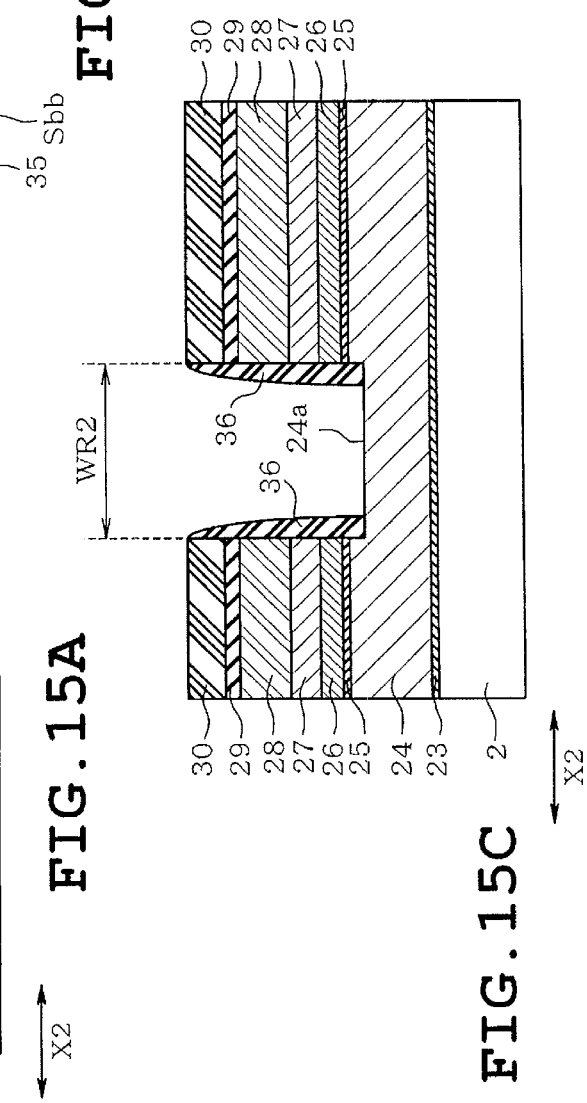
FIG. 15A
FIG. 15B
FIG. 15C

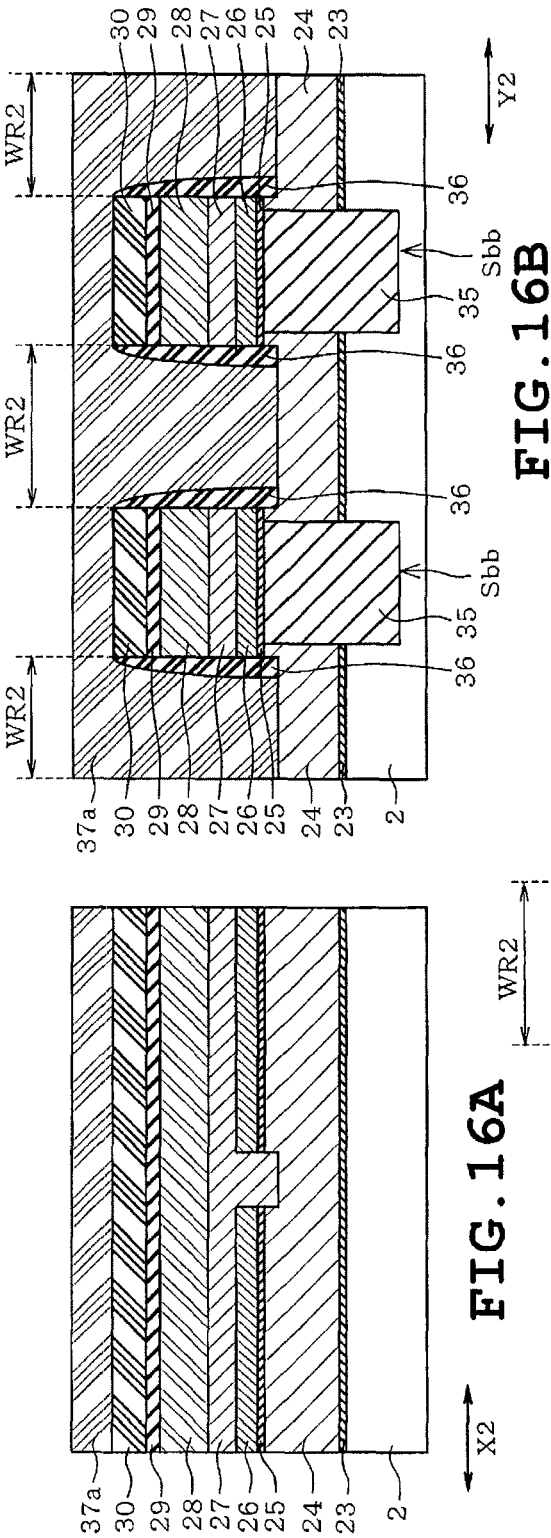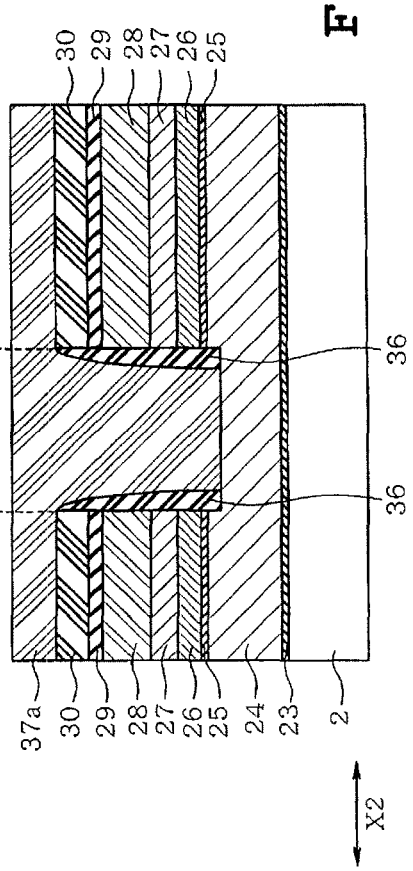

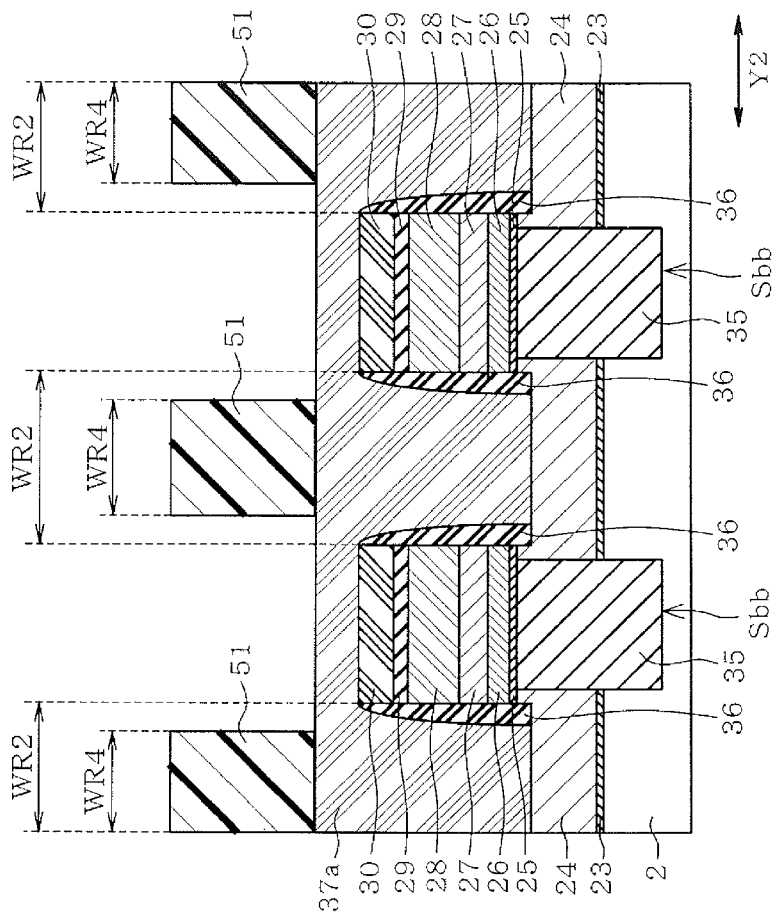
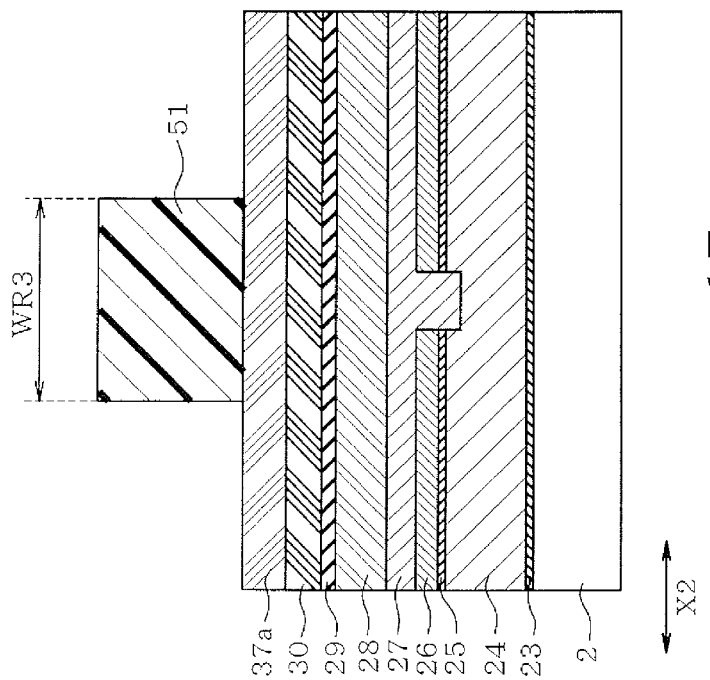
FIG. 17B
FIG. 17A

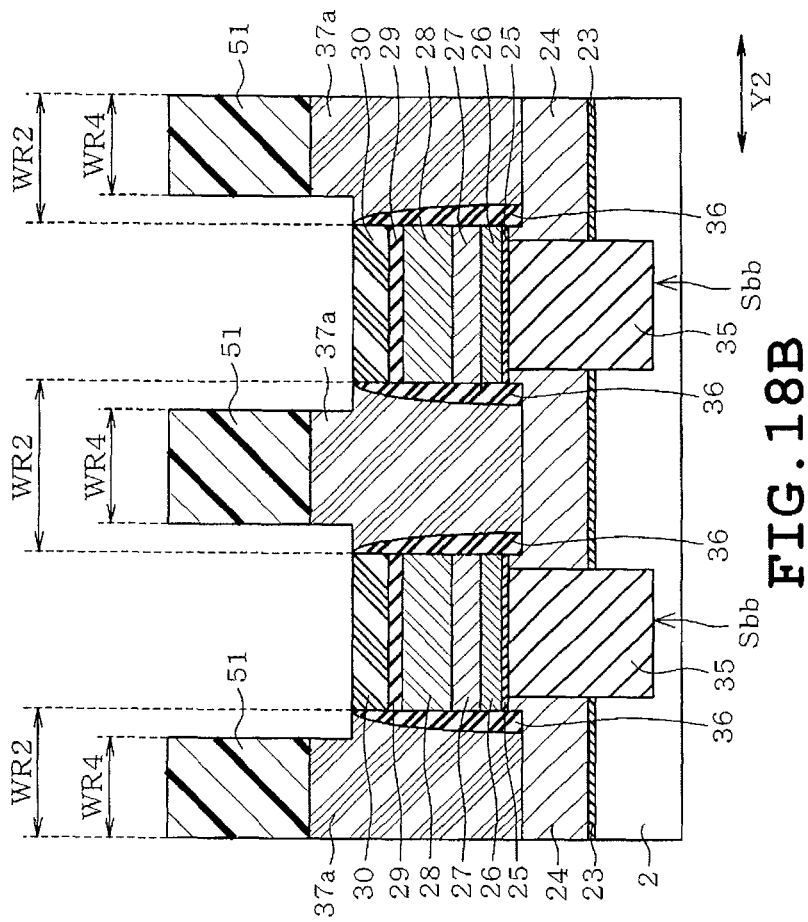
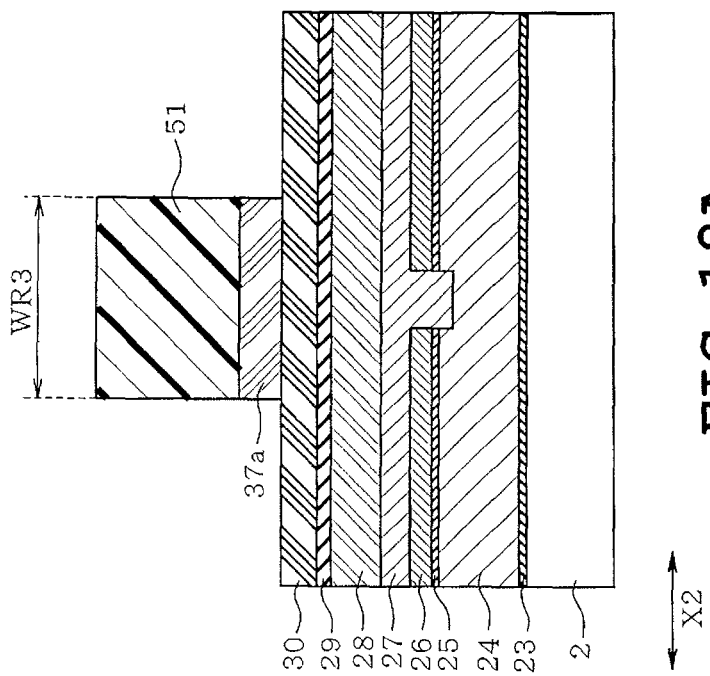
FIG. 18A
FIG. 18B

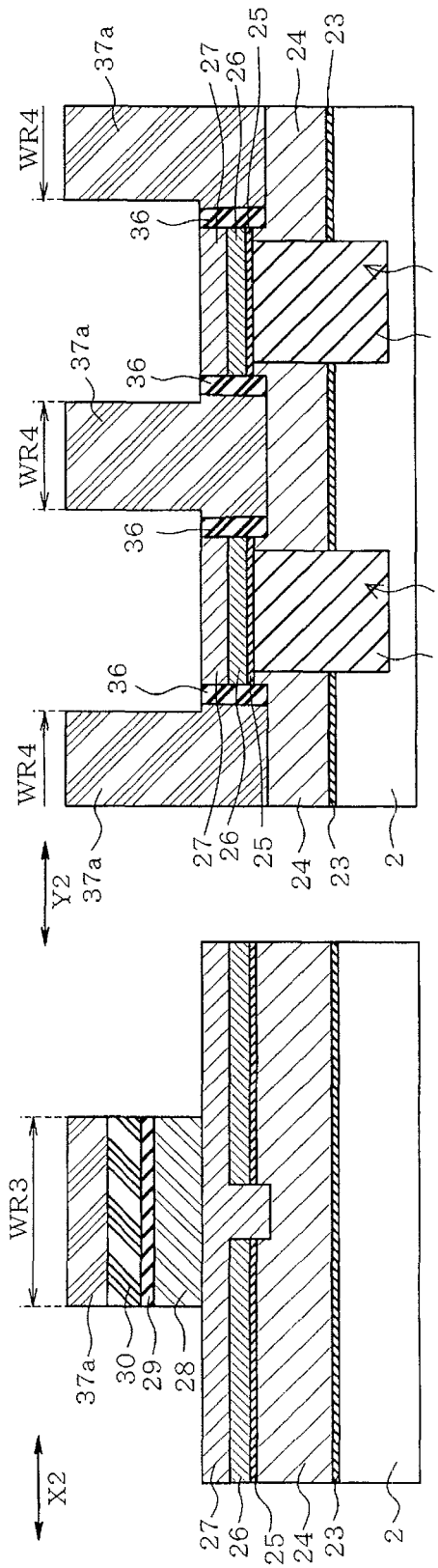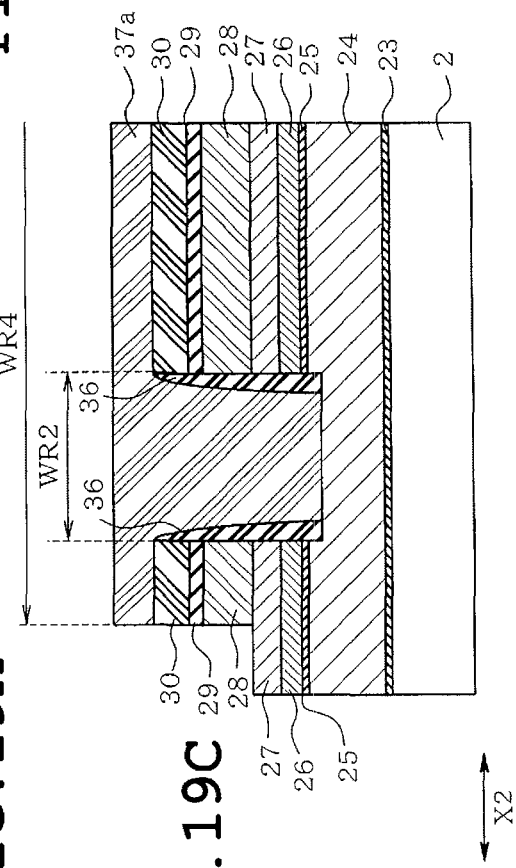

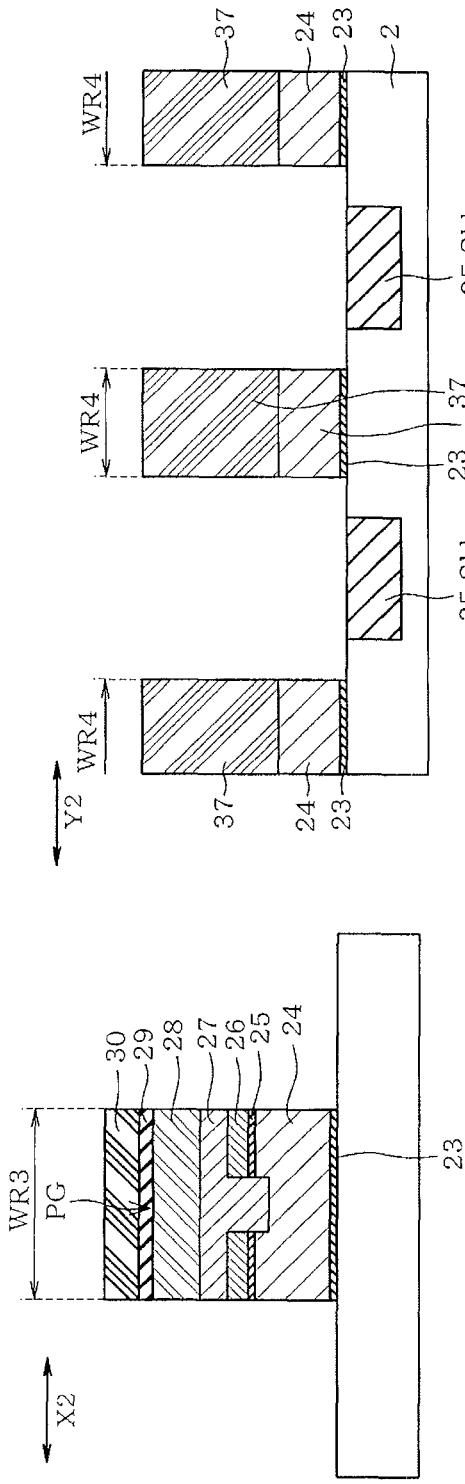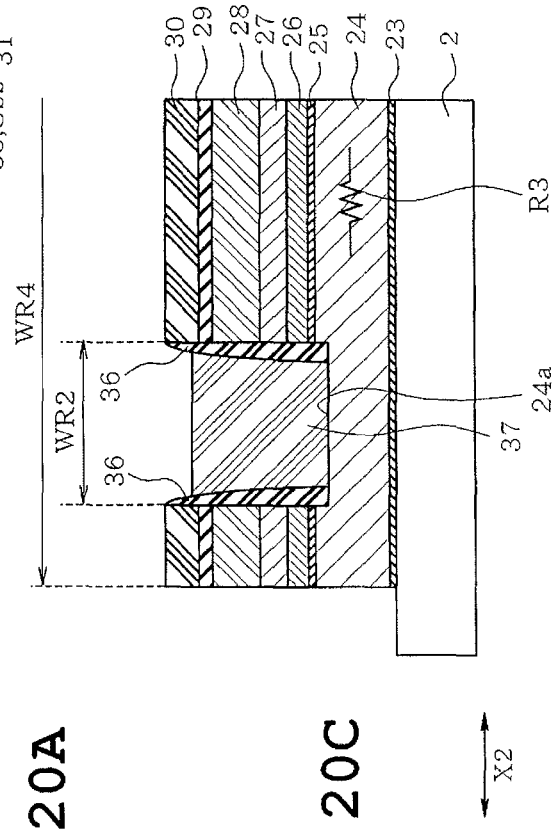

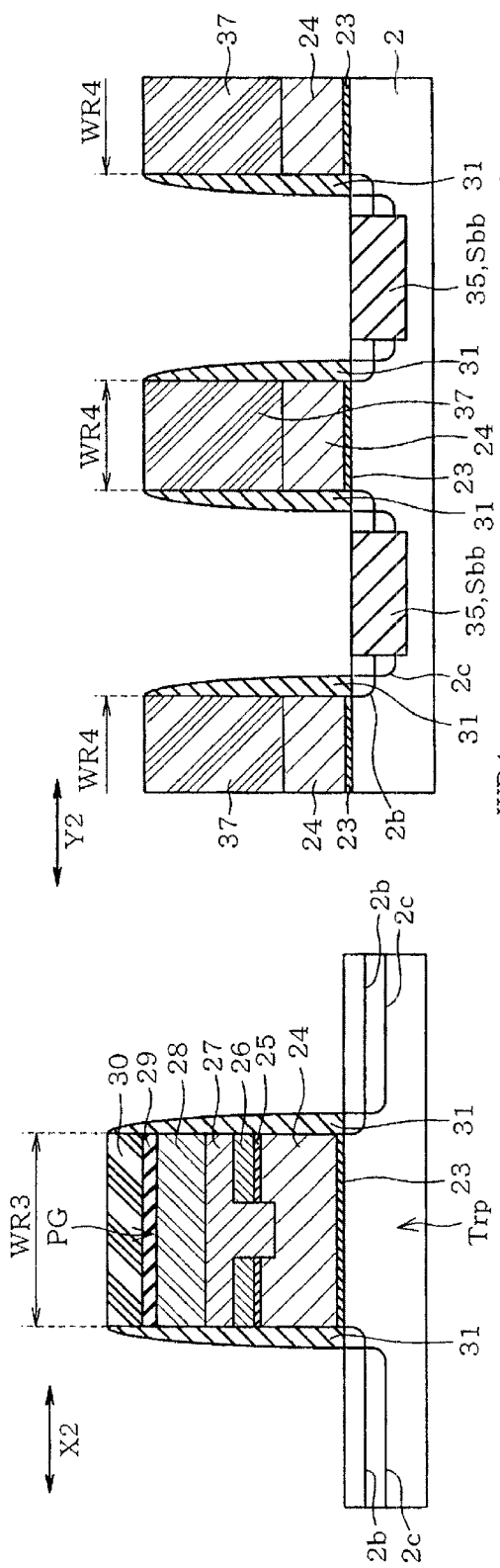
FIG. 21C
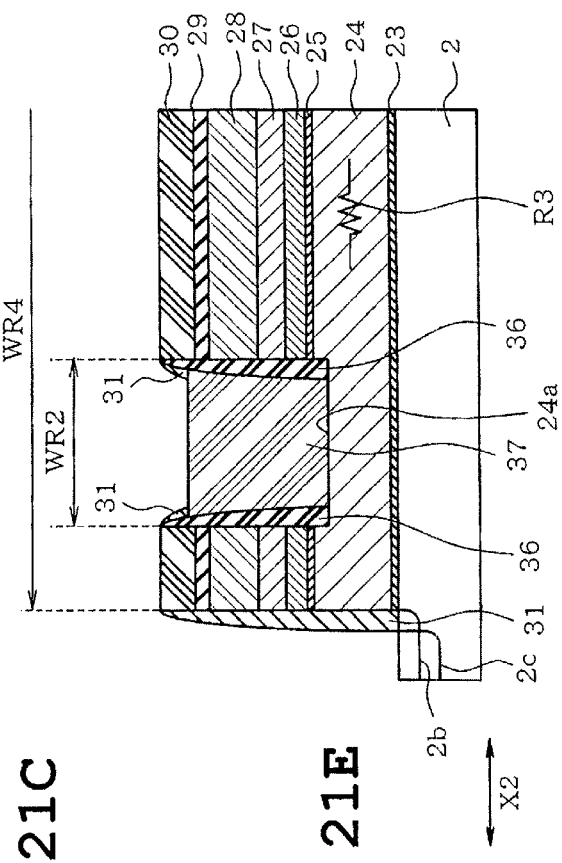
FIG. 21D
FIG. 21E

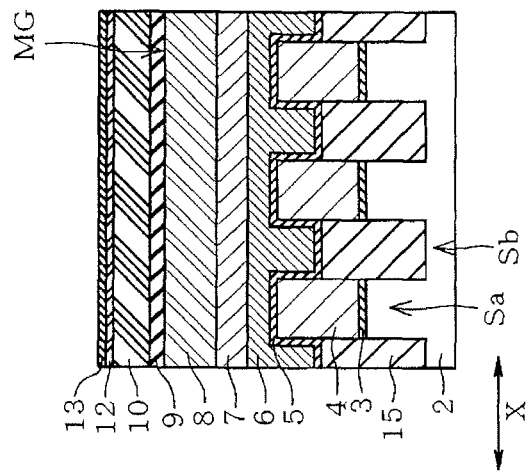
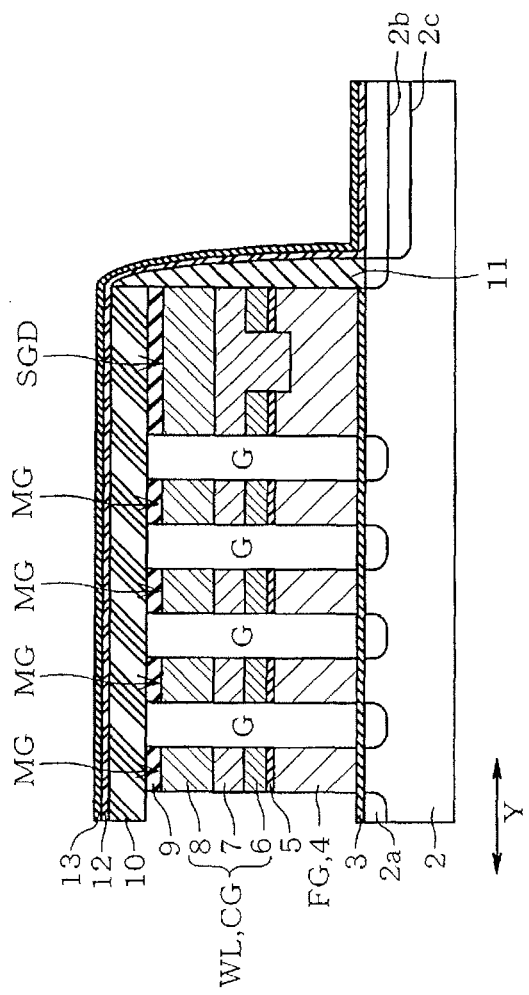
FIG. 22B
FIG. 22A

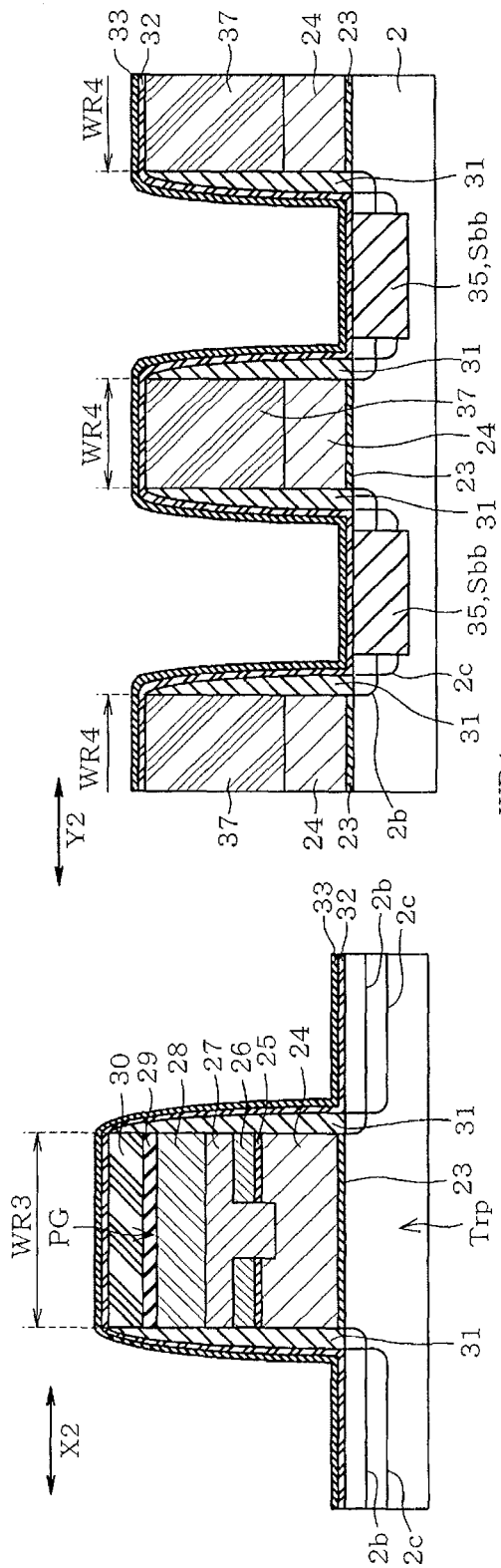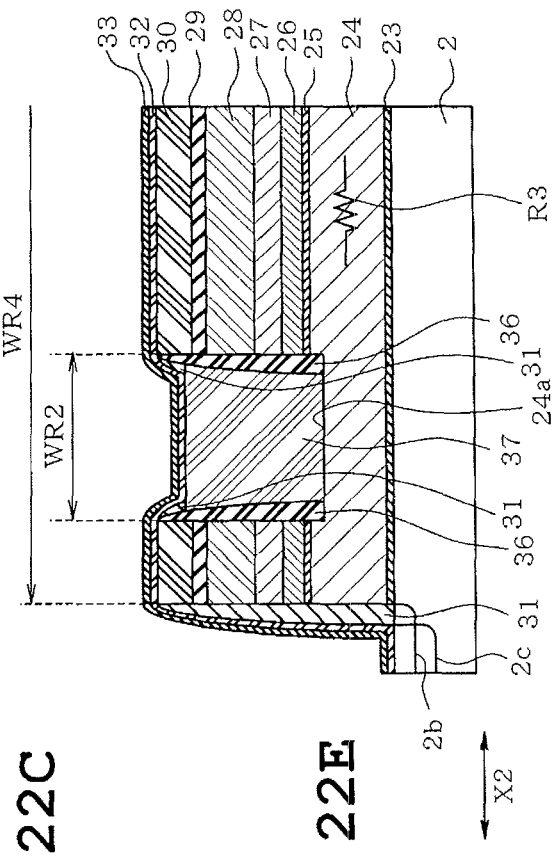

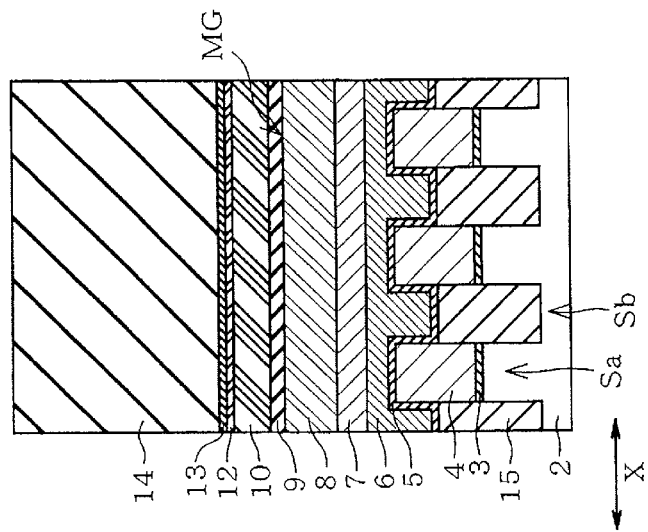
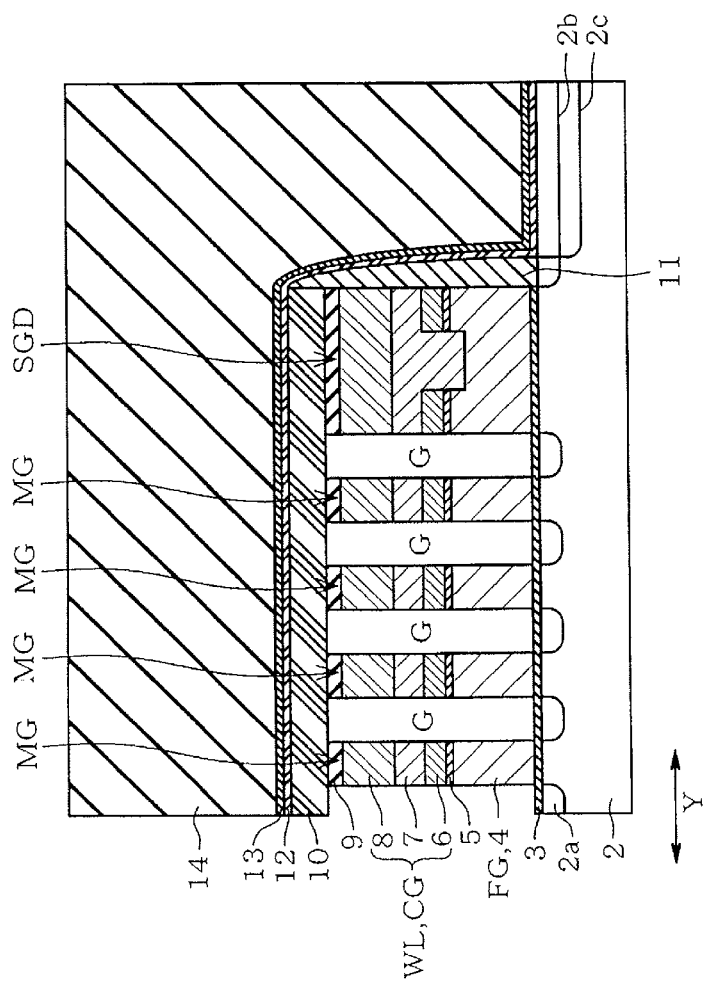
FIG. 23A
FIG. 23B

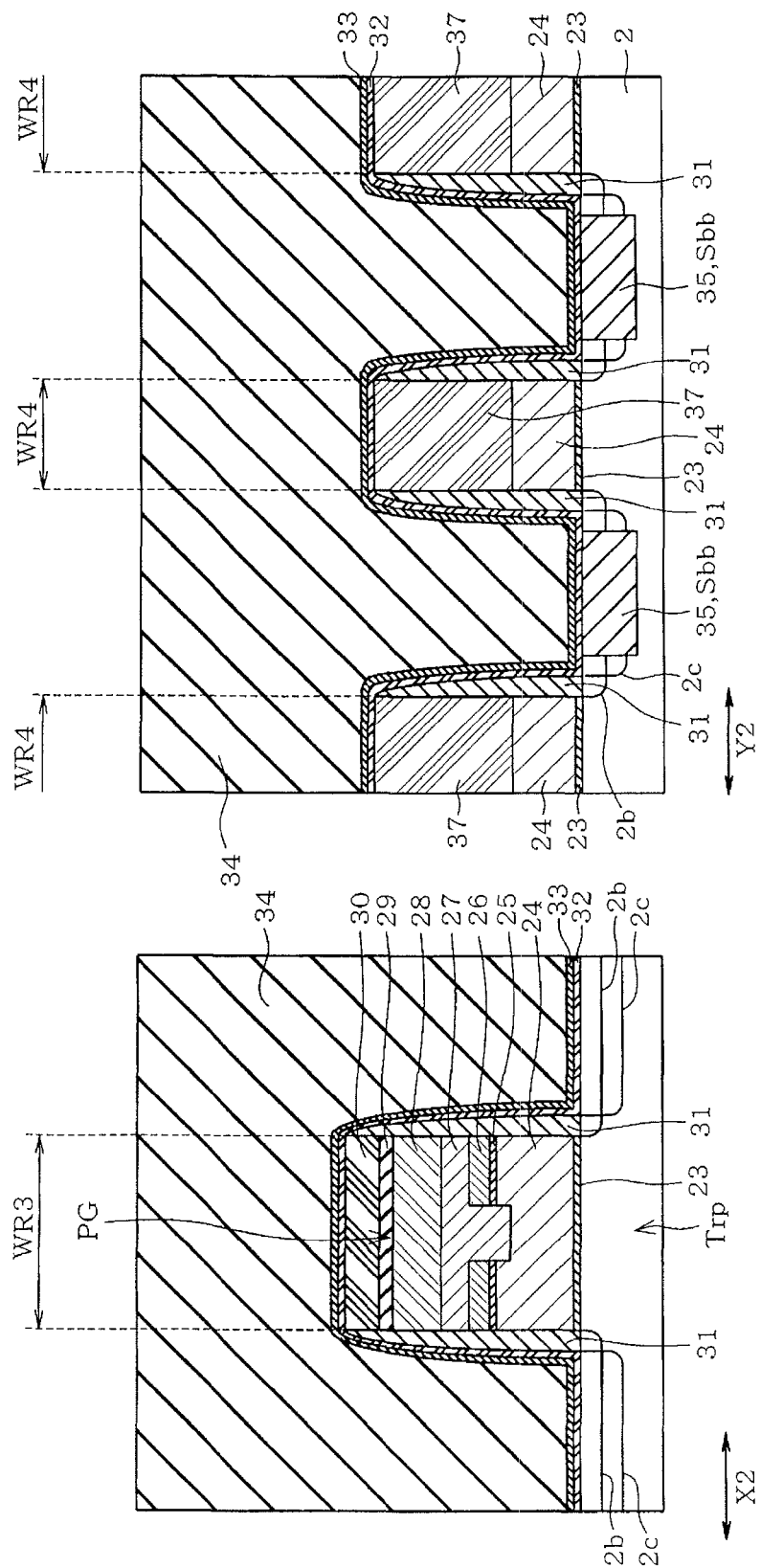

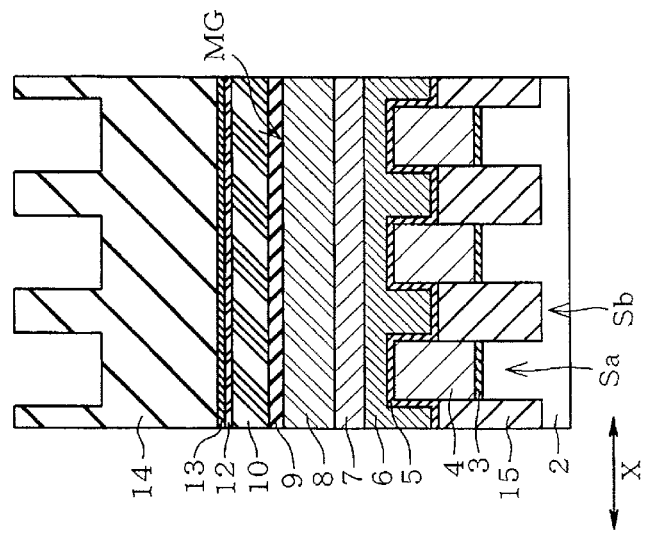
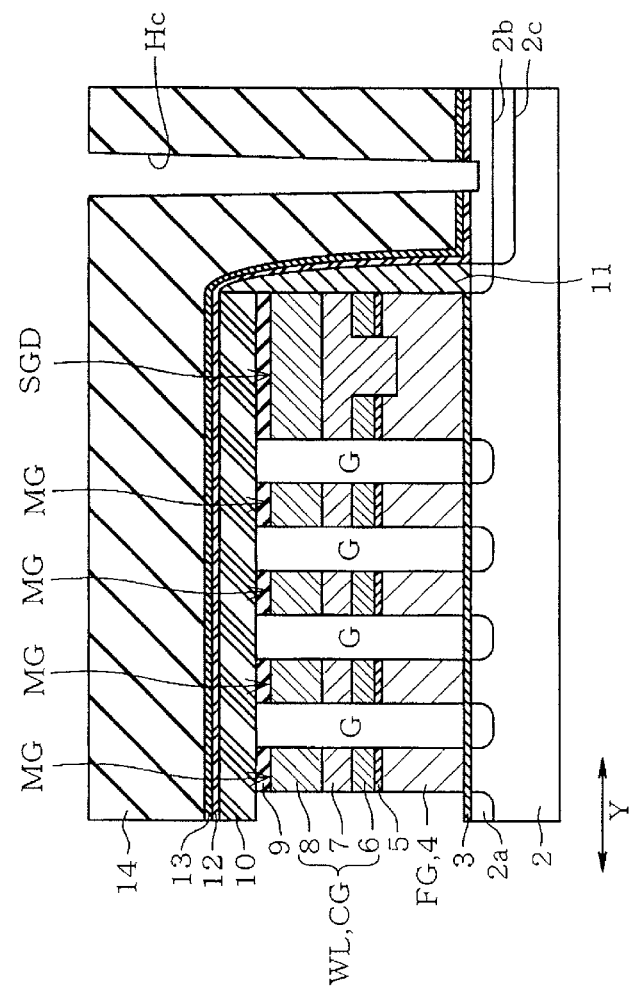
FIG. 24A
FIG. 24B

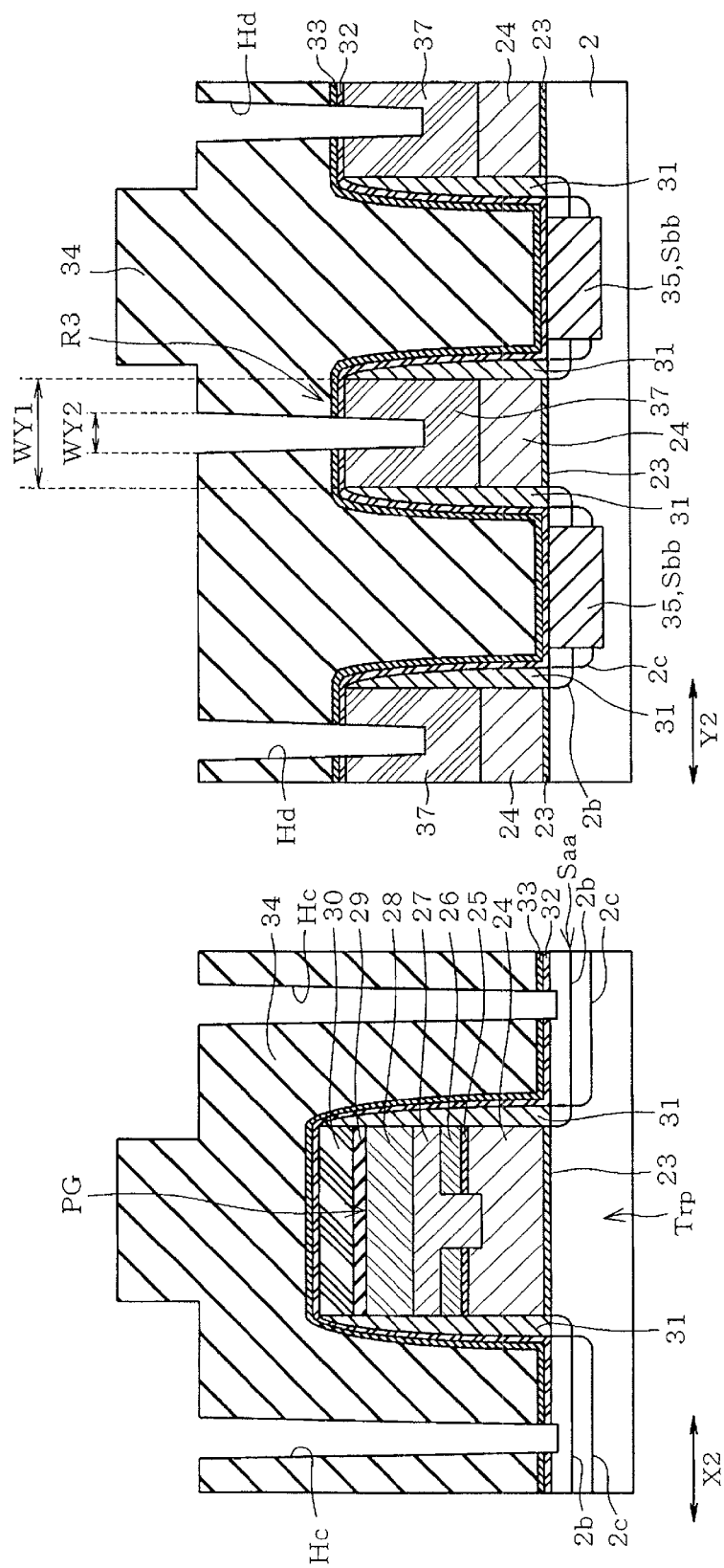

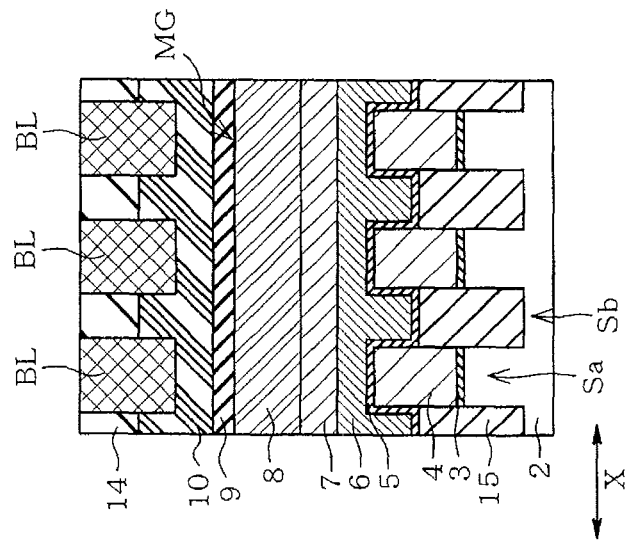
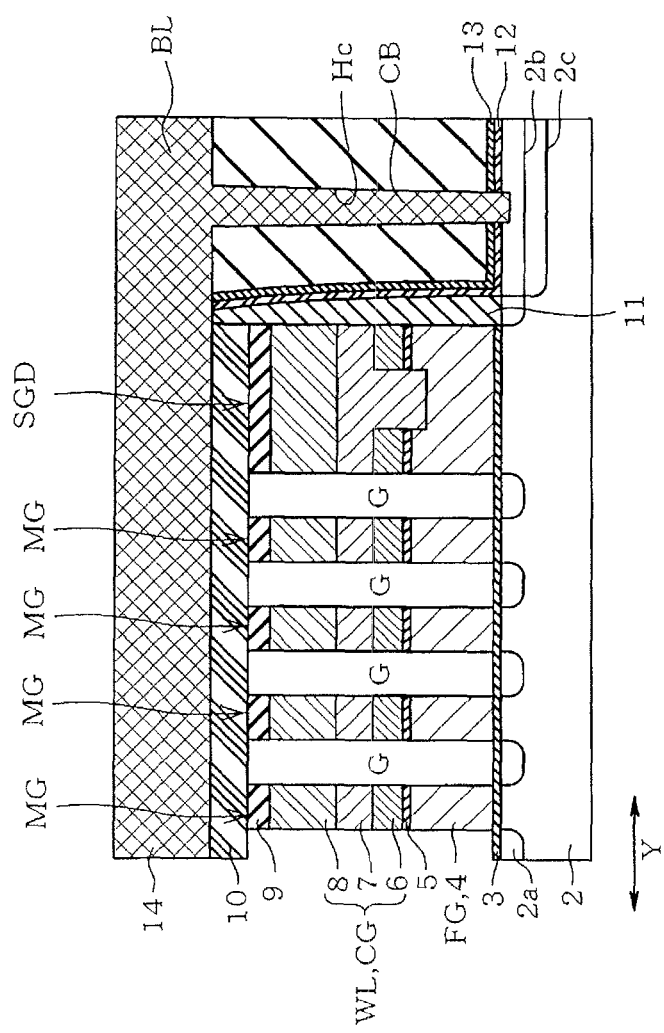
FIG. 25A
FIG. 25B

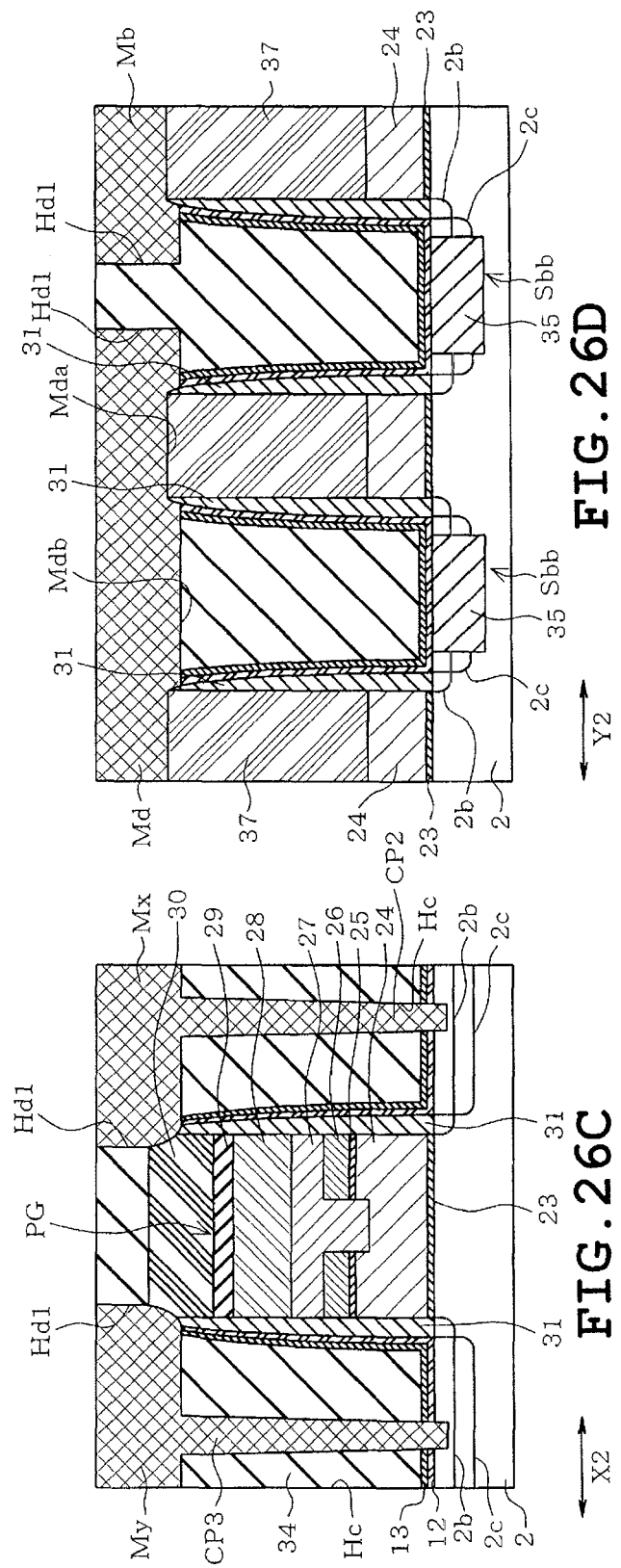

NON-VOLATILE SEMICONDUCTOR MEMORY DEVICE

CROSS-REFERENCE TO RELATED APPLICATION

This application is based upon and claims the benefit of priority from U.S. Provisional Patent Application No. 61/951,346, filed Mar. 11, 2014, the entire contents of which are incorporated herein by reference.

FIELD

Exemplary embodiments described herein relate to a semiconductor memory device.

BACKGROUND

Non-volatile semiconductor memory devices have a memory cell region having memory cells and a peripheral circuit region adjacent to the memory cells, having a peripheral circuit which drives the memory cells. The memory cells and peripheral circuit are configured on a single semiconductor die or chip. The memory cells of the memory cell region have a stack gate structure in which for example, a first conductive film to become a charge storage layer, an inter-conductive film insulating film, and a second conductive film to become control circuit are deposited one over the other on a semiconductor substrate via an insulating film. The peripheral circuit of the peripheral circuit region is provided with peripheral elements such as resistance elements and capacitance elements, as well as various transistors and other necessary structures. The peripheral circuit drives the memory cells using these peripheral elements.

In the semiconductor process, the memory cells and the peripheral elements are approximately simultaneously formed in the memory cell region and in the peripheral circuit region, respectively. Therefore, the peripheral elements may be formed using the above-described stack gate structure of the memory cell region in the peripheral circuit region.

When the peripheral elements are formed, contact electrodes are connected to an upper surface of the first conductive film. When a contact hole is formed in an overlying insulative layer down to the upper surface of the first conductive film in which this contact electrode is formed, the upper surface of the first conductive film may be overetched. When the contact electrode is formed in the hole in the first conductive film, the contact electrode may actually extend to the semiconductor substrate.

BRIEF DESCRIPTION OF THE DRAWINGS

FIG. 4A is a longitudinal sectional view schematically illustrating an example of the structural cross-section of a portion of the memory cell region according to the first embodiment, taken along the line 4A-4A of FIG. 2.

FIG. 4B is a longitudinal sectional view schematically illustrating an example of the structural cross-section of a portion of the memory cell region according to the first embodiment, taken along the line 4B-4B of FIG. 2.

FIGS. 5A, 6A, 7A, 8A, 9A, 10A, 11A, 12A, 13A, 14A, 21A, 22A, 23A, and 24A are longitudinal sectional views schematically illustrating examples (1 to 14) of the structural cross-section of a portion of the memory cell region in one manufacturing stage according to the first embodiment, taken along the line 4A-4A of FIG. 2.

FIGS. 5B, 6B, 7B, 8B, 9B, 10B, 11B, 12B, 13B, 14B, 21B, 22B, 23B, and 24B are longitudinal sectional views schematically illustrating examples (1 to 14) of the structural cross-section of a portion of the memory cell region in one manufacturing stage according to the first embodiment, taken along the line 4B-4B of FIG. 2.

FIGS. 5C, 6C, 7C, 8C, 9C, 10C, 11C, 12C, 13C, 14C, 15A, 16A, 17A, 18A, 19A, 20A, 21C, 22C, 23C, and 24C are longitudinal sectional views schematically illustrating examples (1 to 20) of the structural cross-section of a portion of the peripheral circuit region in one manufacturing stage according to the first embodiment, taken along the line 4C-4C of FIG. 3A.

FIGS. 5D, 6D, 7D, 8D, 9D, 10D, 11D, 12D, 13D, 14D, 15B, 16B, 17B, 18B, 19B, 20B, 21D, 22D, 23D, and 24D are longitudinal sectional views schematically illustrating examples (1 to 20) of the structural cross-section of a portion of the peripheral circuit region in one manufacturing stage according to the first embodiment, taken along the line 4D-4D of FIG. 3B.

FIGS. 5E, 6E, 7E, 8E, 9E, 10E, 11E, 12E, 13E, 14E, 15C, 16C, 17C, 18C, 19C, 20C, 21E, 22E, 23E, and 24E are longitudinal sectional views schematically illustrating examples (1 to 20) of the structural cross-section of a portion of the peripheral circuit region in one manufacturing stage according to the first embodiment, taken along the line 4E-4E of FIG. 3B.

FIG. 25A is a longitudinal sectional view schematically illustrating an example of the structural cross-section of a portion of a memory cell region according to a second embodiment, taken along the line 4A-4A of FIG. 2.

FIG. 25B is a longitudinal sectional view schematically illustrating an example of the structural cross-section of a portion of the memory cell region according to the second embodiment, taken along the line 4B-4B of FIG. 2.

FIG. 26C is a longitudinal sectional view schematically illustrating an example of a structure of a peripheral transistor of a peripheral circuit region according to the third embodiment, taken along the line 4C-4C of FIG. 3A.

FIG. 26D is a longitudinal sectional view schematically illustrating an example of a structure of a resistance element of the peripheral circuit region according to the third embodiment, taken along the line 4D-4D of FIG. 3B.

DETAILED DESCRIPTION

According to an embodiment, a semiconductor memory device includes a semiconductor substrate, a first insulating film disposed on the semiconductor substrate, a first conductive film disposed on the first insulating film, a second insulating film disposed on the first conductive film, a second conductive film disposed on the second insulating film, a first electrode disposed on the first conductive film through an opening formed in the second conductive film and the second insulating film, and having a first width, a second electrode that is formed on the first electrode and having a second width, and a wiring layer that is formed on the second electrode. A first width of the first electrode is wider than a second width of the second electrode.

According to an embodiment, a semiconductor memory device includes: a semiconductor substrate; a first insulating film formed on the semiconductor substrate; a first conductive film formed on the first insulating film; a second insulating film formed on the first conductive film; a second conductive film formed on the second insulating film; an electrode formed on the first conductive film through an opening formed in the second conductive film and the second insulating film; a first spacer film formed between the second conductive film and the electrode; and a wiring layer formed on the electrode, in which the wiring layer is formed along an upper side surface of the first spacer film, and has a width, in an upper end of the first spacer film, wider than a width of an upper surface of the electrode.

Hereinafter, several embodiments applied to a NAND flash memory device as a non-volatile semiconductor memory device will be described with reference to the drawings. The drawings are schematic drawings, and the relationships between thicknesses and plane dimensions, ratios of thicknesses of the respective layers, and the like do not necessarily coincide with real ones. In addition, upward, downward, leftward, and rightward directions indicate relative directions when a circuit forming surface side of a semiconductor substrate to be described later is defined as an upper side, and do not necessarily coincide with directions based on a gravitational acceleration direction. In the following description, an XYZ coordinate system may be used. X- and Y-directions indicate main surface directions of a semiconductor substrate 2, and a Z-direction indicates a direction intersecting and perpendicular to the X- and Y-directions.

First Embodiment

Figure 1:
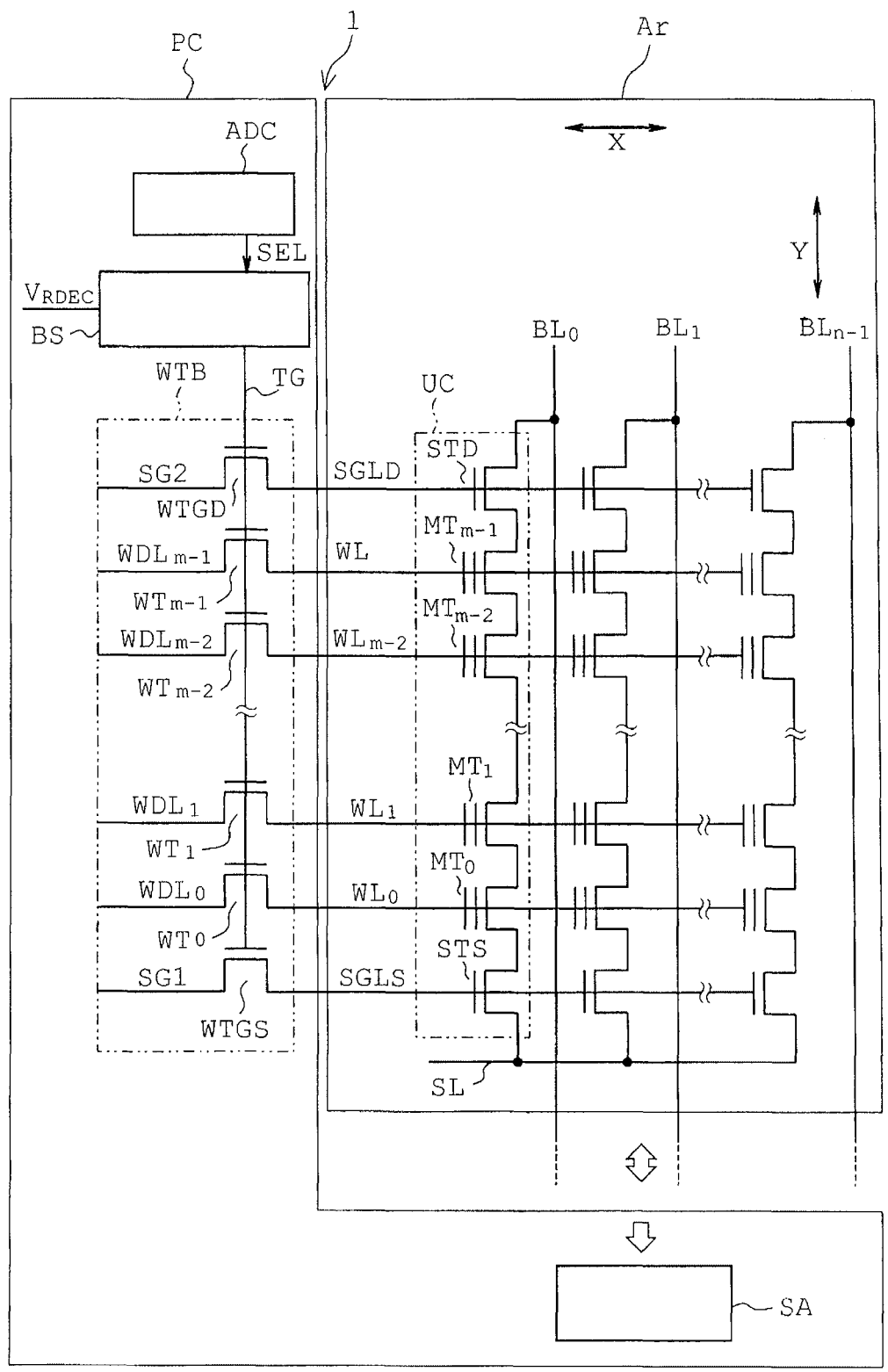
FIG. 1 is a circuit diagram schematically illustrating an example of an electrical configuration in all of embodiments.

FIG. 1 schematically illustrates an example of an electrical circuit configuration of a NAND flash memory device. As illustrated in FIG. 1, a NAND flash memory device 1 has a memory cell array Ar which has a large number of memory cells disposed in a matrix, and a peripheral circuit PC which performs reading, writing, and erasing operations, i.e., drives, the respective memory cells of the memory cell array Ar.

A plurality of cell units UC are disposed in the memory cell array Ar in a memory cell region. A cell unit UC is provided with a selector transistor STD connected to a bit line BL, a selector transistor STS connected to a source line SL, and for example, and 64 memory cells MT connected in series between the plurality of selection transistors STD and STS. A dummy transistor (not shown) may be provided between a selection transistor STD and a memory cell MT adjacent to the selection transistor STD, and a dummy transistor (not shown) may be provided between a selection transistor STS and a memory cell MT adjacent to the selection transistor STS.

A block is configured with cell units UC disposed in parallel in n rows in an X-direction (horizontal direction in FIG. 1). The memory cell array Ar has a plurality of blocks disposed in a Y-direction (vertical direction in FIG. 1). FIG. 1 illustrates only one block to simplify the description.

A peripheral circuit region is provided on the periphery, i.e., to one side of, the memory cell region, and a peripheral circuit PC is disposed in the peripheral circuit region on the periphery of the memory cell array Ar. This peripheral circuit PC is provided with an address decoder ADC, a sense amplifier SA, a booster circuit BS having a charge pump circuit, a transfer transistor portion WTB, and the like. The address decoder ADC is electrically connected to the transfer transistor portion WTB via the booster circuit BS.

The address decoder ADC selects one block in response to an address signal given from the outside. When a block selection signal is given, the booster circuit BS boosts a driving voltage supplied from the outside and supplies a predetermined voltage to each of transfer gate transistors WTGD, WTGS, and WT via a transfer gate line TG.

The transfer transistor portion WTB is provided with a transfer gate transistor WTGD, a transfer gate transistor WIGS, a word line transfer gate transistor WT, and the like. A transfer transistor portion WTB is provided corresponding to each block.

One of a drain and a source of the transfer gate transistor WTGD is connected to a selection gate driver line SG2, and the other is connected to a selection gate line SGLD. One of a drain and a source of the transfer gate transistor WTGS is connected to a selection gate driver line SG1, and the other is connected to a selection gate line SGLS. One of a drain and a source of the transfer gate transistors WT is connected to an individual word line driving signal lines WDL, and the other is connected to an individual word lines WL extending across the memory cell array Ar.

In the plurality of individual cell units UC extending and spaced in the X-direction, a gate (the reference sign SGD in FIG. 2) of each selection transistor STD is electrically connected through the selection gate line SGLD. A gate of each selection transistor STS is electrically connected through the selection gate line SGLS. A source of the selection transistor STS is commonly connected to the source line SL. A gate (the reference sign MG in FIG. 2) of each of the memory cells MT of the plurality of cell units UC disposed in the X-direction is electrically connected through the word line WL.

The transfer gate transistors WTGD, WTGS, and WT are commonly connected to each other by gates through a transfer gate line TG, and are connected to a boosting voltage supply terminal of the booster circuit BS. The sense amplifier SA is connected to a bit line BL, and is connected to a latch circuit which temporarily stores data during reading of the data.

Figure 2:
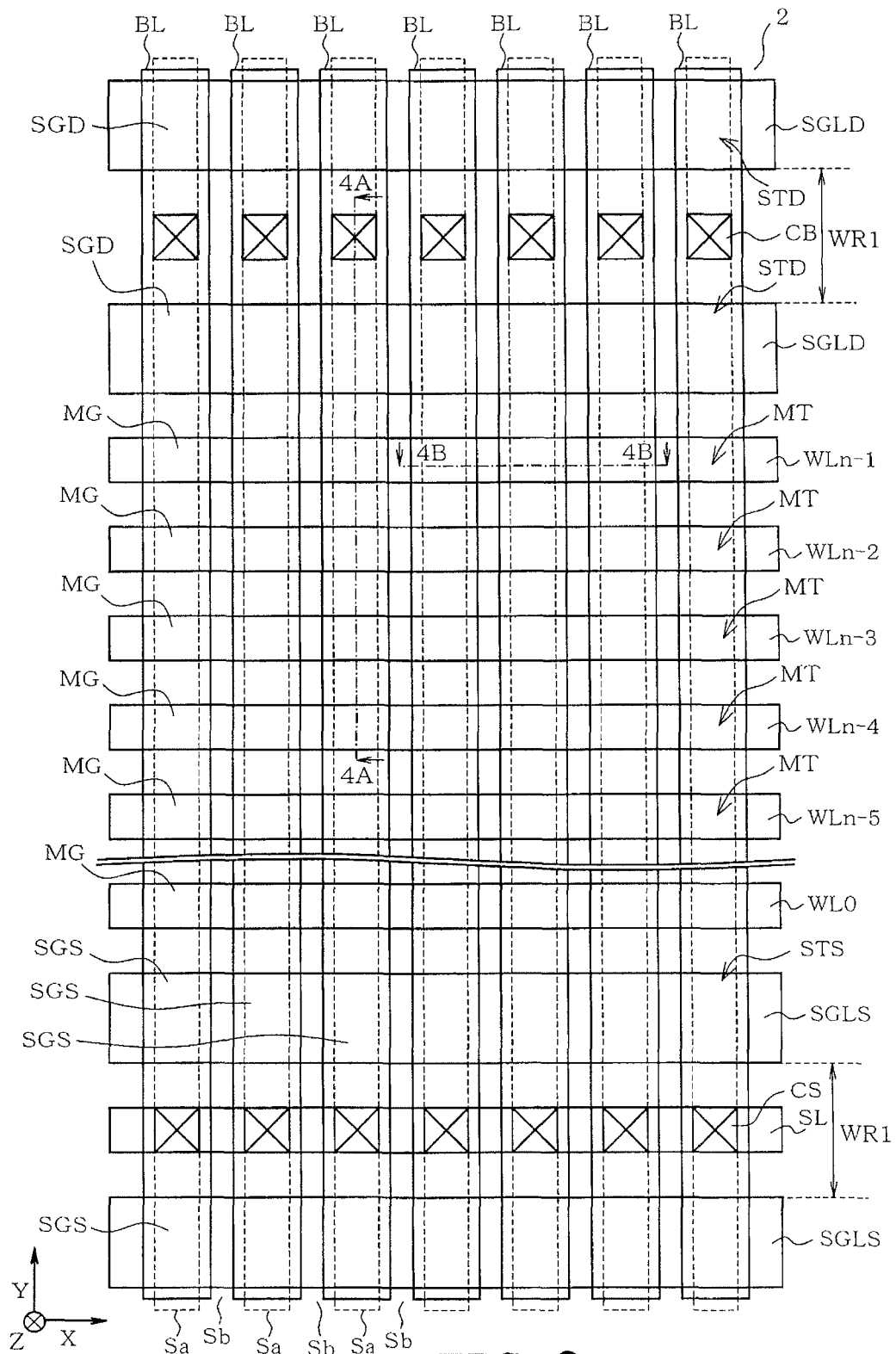
FIG. 2 is a plan view schematically illustrating an example of a structure of a memory cell region in all of the embodiments.
Figure 3B:
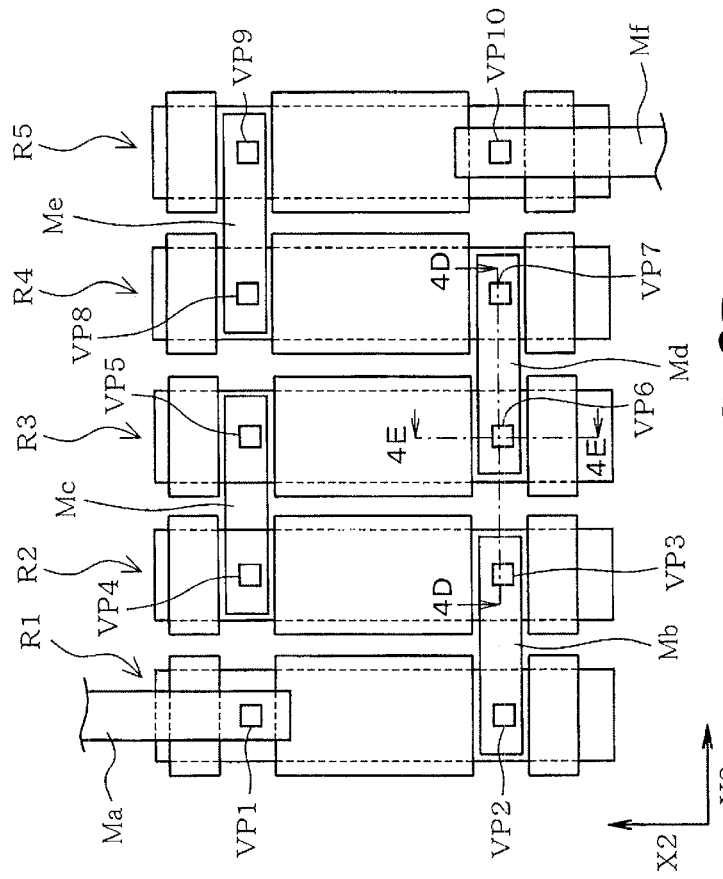
FIG. 3B is a plan view schematically illustrating an example of structures of resistance elements of the peripheral circuit region according to the first embodiment.
Figure 3A:
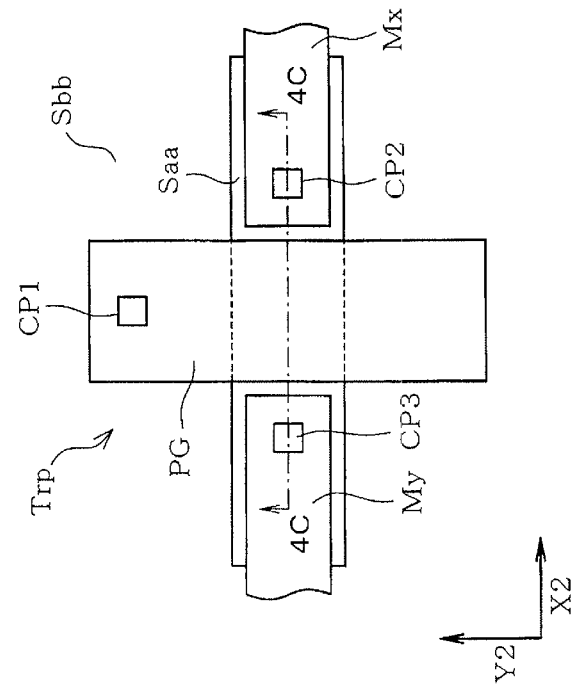
FIG. 3A is a plan view schematically illustrating an example of a structure of a peripheral transistor of a peripheral circuit region according to a first embodiment.

FIG. 2 illustrates an example of a layout pattern of a portion of the memory cell region. FIGS. 3A and 3B each illustrate an example of a layout pattern of a portion of the peripheral circuit region. The peripheral circuit PC and the memory cell array Ar configure a semiconductor substrate 2. The semiconductor substrate 2 is formed using, for example, a p-type single crystal silicon substrate.

As illustrated in FIG. 2, in a memory cell region of the semiconductor substrate 2, an element separation region Sb, for example an isolation trench, extends in the Y-direction in FIG. 2. This element separation region Sb is configured having an insulating film embedded in a trench formed in the semiconductor substrate 2 or an overlying semiconductor film in the Y-direction of FIG. 2, and is an element separation region having a so-called shallow trench isolation (STI) structure.

A plurality of element separation regions Sb are formed at predetermined intervals spaced in the X-direction in FIG. 2. Accordingly, an element region Sa is formed therebetween and extends in the Y-direction in FIG. 2, and the plurality of element regions Sa are separately formed and isolated from one another in the X-direction in a surface layer portion of the semiconductor substrate 2.

A word line WL is formed to extend in a direction (X-direction in FIG. 2) perpendicular to and intersecting the element regions Sa. A plurality of word lines WL are formed at predetermined intervals in the Y-direction in FIG. 2. A gate MG of a memory cell MT is formed on the element region Sa intersecting the word line WL.

A plurality of memory cells MT adjacent to each other in the Y-direction configures a NAND string between opposed selector transistors STD, STS. The selector transistors STD and STS are thus respectively provided adjacent to the opposed ends in the Y-direction of the memory cells MT at opposed end portions of the NAND string.

A plurality of selector transistors STD are provided across the memory array block in the X-direction corresponding to the number of element regions in the block, and gates SGD of the plurality of selector transistors STD are electrically connected through the selection gate line SGLD. The gate SGD of the selection transistor STD is formed above the element regions Sa intersecting the selection gate line SGLD.

A plurality of selection transistors STS are provided across the memory array block in the X-direction corresponding to the number of element regions in the block, and gates SGS of the plurality of selection transistors STS are electrically connected through the selection gate line SGLS. The gate SGS of the selection transistor STS are formed above the element region Sa intersecting the selection gate line SGLS.

A bit line contact electrode CB is formed on each element region Sa at a location thereof between the selection transistors STD of two blocks adjacent to each other, i.e., at the end of the memory cell string. This bit line contact electrode CB is a contact which electrically connects a bit line BL formed to extend in the Y-direction above and over the element region Sa (Z-direction) and the element region Sa of the semiconductor substrate 2.

A source line contact electrode CS is formed on the element region Sa between the selection transistors STS of two blocks adjacent to each other, i.e., at the other end of the memory cell string. This source line contact electrode CS is a contact which electrically connects a source line SL formed to extend in the X-direction above the element region Sa (Z-direction) and the element region Sa of the semiconductor substrate 2. Here, a region where the bit line contact electrode CB and the source line contact electrode CS are formed is also called a forming region WR1.

FIG. 3A illustrates an example of a schematic layout of a transistor Trp in the peripheral circuit region. An element separation region Sbb is formed in the semiconductor substrate 2 of the peripheral circuit region. This element separation region Sbb is configured so that a rectangular trench (not shown) is formed to create a rectangular element region Saa, and an insulating film is embedded in the trench. This element separation region Sbb is an element separation region having a so-called shallow trench isolation (STI) structure.

The transistor Trp is formed in the element region Saa having a rectangular shape in X2- and Y2-directions, and is provided with a gate PG formed to cross above the element region Saa in a predetermined direction (Y2-direction in FIG. 3A). That is, the gate PG is formed to extend in the Y2-direction above the element region Saa and to extend to the element separation region Sbb.

The transistor Trp is provided with a source-drain region (see 2b and 2c of FIG. 4C) formed in a LDD structure in the element regions Saa on both sides of the gate PG. A gate contact CP1 is formed on the gate PG so as to be in contact therewith. When viewed from above, it is disposed over the element separation region Sbb on the outer side of the element region Saa.

In addition, a contact electrode CP2 is formed on the element region Saa on one side of the gate PG in the X2-direction so as to be in contact therewith. An upper layer wiring Mx is formed on the contact electrode CP2. Furthermore, a contact electrode CP3 is formed on the element region Saa on the other side of the gate PG in the X2-direction so as to be in contact therewith. An upper layer wiring My is formed on the contact electrode CP3.

FIG. 3B illustrates an example of a layout of resistance elements of the peripheral circuit region. Resistance elements R1 to R5 may be formed at the same time as the memory cells MT are formed using the same processes as those of forming the memory cells MT in the memory cell region. These resistance elements R1 to R5 are disposed so as to be separated from each other in the Y2-direction. The respective resistance elements R1 to R5 are configured so that a plug (the reference numeral 37 in FIGS. 4D and 4E) made of polysilicon is provided as a first contact electrode, and on this first contact electrode 37, contact electrodes VP1 to VP10 are disposed as second contact electrodes.

The contact electrodes VP1 and VP2 each extend to the first contact electrode (see the reference numeral 37 and the like in FIGS. 4D and 4E) and spaced from each other in the X2-direction, and a polysilicon film (see the reference numeral 24 and the like in FIG. 4E to be described later)

formed between the contact electrodes VP1 and VP2 is configured as a main element of the resistance element R1. The contact electrodes VP3 and VP4 are each disposed on the contact electrode 37 spaced from each other in the X2-direction, and a polysilicon film 24 between the contact electrodes VP3 and VP4 is configured as a main element of the resistance element R2.

The contact electrodes VP5 and VP6 each extend to the contact electrode (see the reference numeral 37 and the like in FIGS. 4D and 4E) and spaced from each other in the X2-direction, and a polysilicon film (see the reference numeral 24 and the like in FIG. 4E to be described later) between the contact electrodes VP5 and VP6 is configured as a main element of the resistance element R3. The contact electrodes VP7 and VP8 each extend to a contact electrode (see the reference numeral 37 and the like in FIGS. 4D and 4E) and are spaced from each other in the X2-direction, and a polysilicon film (see the reference numeral 24 and the like in FIG. 4E to be described later) between the contact electrodes VP7 and VP8 is configured as a main element of the resistance element R4. The contact electrodes VP9 and VP10 each extend to a contact electrode (see the reference numeral 37 and the like in FIGS. 4D and 4E) and are spaced from each other in the X2-direction, and a polysilicon film (see the reference numeral 24 and the like in FIG. 4E to be described later) between the contact electrodes VP9 and VP10 is configured as a main element of the resistance element R5.

An upper layer wiring Ma is formed as a wiring layer on the contact electrode VP1, and is formed to extend in the X2-direction. An upper layer wiring Mb is formed as a wiring layer on the contact electrodes VP2 and VP3, and is formed to extend in the Y2-direction between the contact electrodes VP2 and VP3.

An upper layer wiring Mc is formed as a wiring layer on the contact electrodes VP4 and VP5, and is formed to extend in the Y2-direction between the contact electrodes VP4 and VP5. An upper layer wiring Md is formed as a wiring layer on the contact electrodes VP6 and VP7, and is formed to extend in the Y2-direction between the contact electrodes VP6 and VP7. An upper layer wiring Me is formed as a wiring layer on the contact electrodes VP8 and VP9, and is formed to extend in the Y2-direction between the contact electrodes VP8 and VP9. An upper layer wiring Mf is formed as a wiring layer on the contact electrode VP10, and is formed to extend in the X2-direction.

Accordingly, these resistance elements R1 to R5 are structurally and electrically connected in the order of the upper layer wiring Ma, the contact electrode VP1 (contact electrode 37), the polysilicon film 24, the contact electrode VP2 (contact electrode 37), the upper layer wiring Mb, . . . , the upper layer wiring Me, the contact electrode VP9 (contact electrode 37), the polysilicon film 24, the contact electrode VP10, and the upper layer wiring Mf, and thus the resistance elements R are connected in series.

Each of FIGS. 4A and 4B schematically illustrates an example of a cross-section structure of a portion of the memory cell region. FIG. 4A is a longitudinal sectional view schematically illustrating an example of structures of the memory cell MT and the selector transistor STD taken along the line 4A-4A of FIG. 2. FIG. 4B is a longitudinal sectional view schematically illustrating an example of a structure of the memory cell MT taken along the line 4B-4B of FIG. 2.

Figures 4C, 4D:
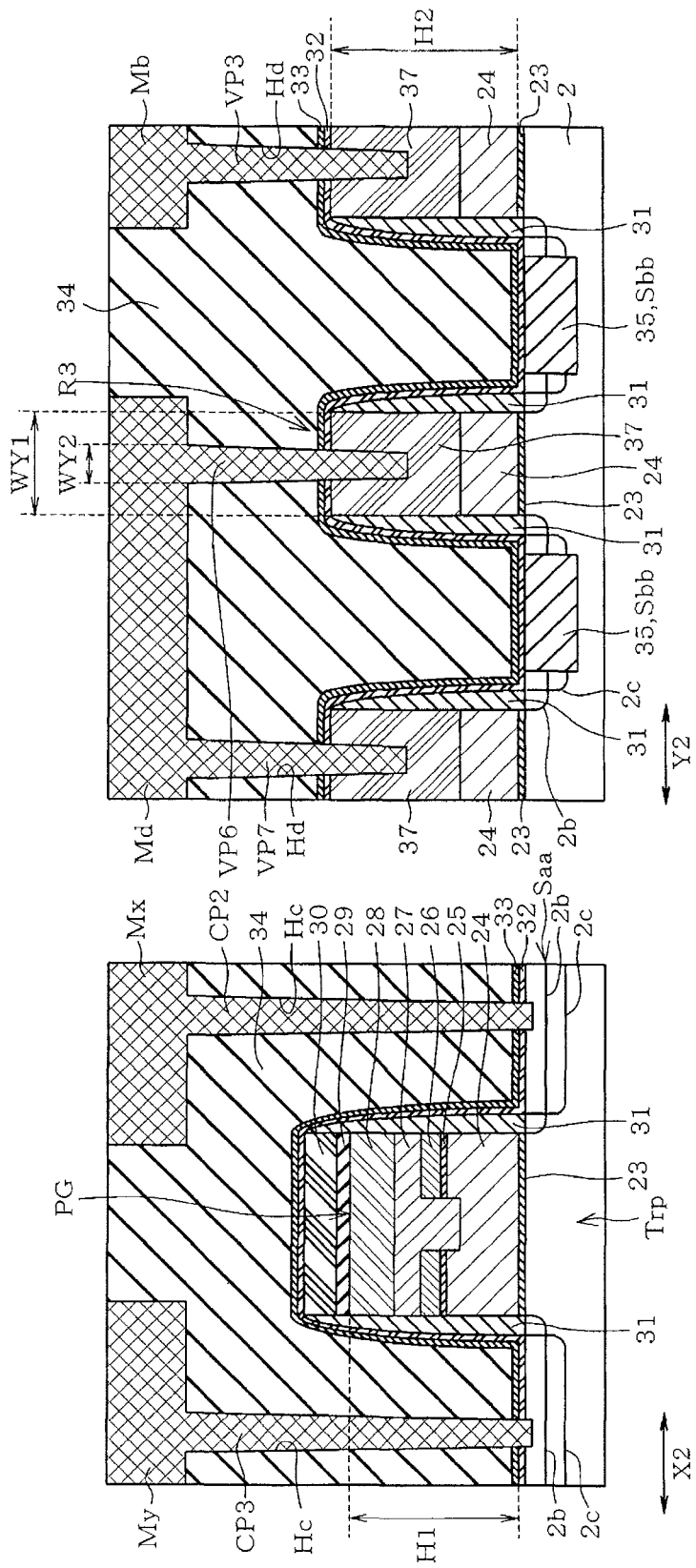
FIG. 4C is a longitudinal sectional view schematically illustrating an example of the structural cross-section of a portion of the memory cell region according to the first embodiment, taken along the line 4C-4C of FIG. 3A.
FIG. 4D is a longitudinal sectional view schematically illustrating an example of the structural cross-section of a portion of the memory cell region according to the first embodiment, taken along the line 4D-4D of FIG. 3B.

FIG. 4C schematically illustrates an example of a cross-sectional structure of the peripheral transistor Trp of taken along the line 4C-4C of FIG. 3. FIG. 4D schematically illustrates an example of a cross-sectional structure of the resistance element of a portion taken along the line 4D-4D of FIG. 3B. FIG. 4E schematically illustrates an example of a cross-sectional structure of the resistance element of a portion taken along the line 4E-4E of FIG. 3B.

FIGS. 4A to 4E illustrate final states after processing with regard to the respective gates MG, SGD, and PG of the memory cell MT, the selection transistor STD, and the peripheral transistor Trp.

First, the cross-section structure of FIG. 4A will be described. In FIG. 4A, a gate insulating film 3 formed of a silicon oxide film or the like is formed as a first insulating film on the upper surface of the semiconductor substrate 2. On an upper surface of the gate insulating film 3, the gates MG of the memory cells MT and the gates SGD of the selection transistors SGT are formed at predetermined intervals. The memory cell MT is configured to include a gate MG, and a source-drain region 2a formed in the surface layer of the semiconductor substrate 2 on both sides of the gate MG. A plurality of memory cells MT is formed adjacent to one another in the Y-direction. The selector transistor STD is formed adjacent to end portions of the memory cells MT. A drain region 2b on a side of the selection transistor STD has a bit line contact electrode CB extending from the bit line BL, and through interlayer insulating film 14, thereto.

The gate MG of the memory cell MT is formed by sequentially forming, on the gate insulating film 3, a polysilicon film 4, an inter-electrode insulating film 5, polysilicon films 6 and 7, and a metal layer 8, followed by a silicon nitride film 9 formed on the metal layer 8.

The polysilicon film 4 is formed as a first conductive film and as a first electrode film, and is configured as a floating electrode FG in the memory cell MT. The inter-electrode insulating film 5 is configured to have a structure, for example, of an oxide-nitride-oxide (ONO) film, a nitride-oxide-nitride-oxide-nitride (NONON) film, or a structure where an intermediate nitride film is replaced by a high-dielectric-constant insulating film (high-k film) having a relative dielectric constant higher than 7. The polysilicon film 6 is formed as a second conductive film and as a second electrode film, and the polysilicon film 7 is formed as a third conductive film and as a third electrode film. The metal layer 8 has a structure in which for example, a tungsten nitride (WN) film to provide a barrier metal film, and a tungsten (W) film to provide a metal film are, are sequentially formed. The polysilicon films 6 and 7 and the metal layer 8 are configured as a control circuit CG and a word line WL.

In the surface layer portion of the semiconductor substrate 2, a source-drain region 2a is formed between the plurality of gates MG and between the gates SGD and the adjacent gate MG. This source-drain region 2a is a diffusion region where after implantation of dopants, the dopants are diffused by a thermal process. In addition, under the bit line contact electrode CB on the side of the selector gate SGD opposite to the last memory gate MG, a dopant diffusion region 2b is shallowly formed, and a dopant diffusion region 2c having a higher dopant concentration than the dopant diffusion region 2b is more deeply formed than the dopant diffusion region 2b.

The gate SGD of the selector transistor STD has approximately the same structure as the gate MG of the memory cell MT. The gate SGD is configured by sequentially forming, on the gate insulating film 3, the polysilicon film 4, the inter-electrode insulating film 5, the polysilicon films 6 and 7, and the metal layer 8, followed by a silicon nitride film 9.

The gate SGD is formed so that an opening is provided in central portions of the polysilicon film 6 and the inter-electrode insulating film 5 and the polysilicon film 7 is embedded in this opening to physically and electrically contact the polysilicon films 4 and 7 with each other.

An air gap G is provided between the gates MG and between the gates MG and SGD. This air gap G is provided to suppress inter-cell interference between the gates MG and between the gates MG and SGD. An insulating film 10 which caps the air gaps G is formed on the silicon nitride film 9 on the respective gates MG and SGD. This insulating film 10 is formed of, for example, a silicon oxide film, and is formed to extend in the Y-direction.

In the present sectional view, the side surface of the selection gate SGD facing away from the gate MG side of the selector gate SGD is covered by spacer film 11 formed on the side surfaces in the Y-direction of the selection gate SGD, the silicon nitride film 9, and the insulating film 10.

A silicon oxide film 12 is formed over the upper surface of the insulating film 10 and an upper surface and a side surface of the spacer film 11, and a silicon nitride film 13 is formed on the silicon oxide film 12 and covers the silicon oxide film 12.

An inter-layer insulating film 14 is formed on the silicon nitride film 13. The material of this inter-layer insulating film 14 is, for example, silicon oxide. A hole Hc is formed in the inter-layer insulating film 14, the silicon nitride film 13, and the silicon oxide film 12, and a conductive material is embedded in the hole Hc to form a bit line contact electrode CB contacting the semiconductor substrate 2 at drain region 2b. The bit line BL is formed on an upper surface of the bit line contact electrode CB and on an upper surface of the inter-layer insulating film 14.

Next, the cross-section structure of FIG. 4B will be described. In FIG. 4B, an element separation film 15 is embedded in the surface layer portion of the semiconductor substrate 2. This element separation film 15 is formed of, for example, a silicon oxide film, and configures an element separation region Sb. The element separation film 15 is embedded from the upper surface of the semiconductor substrate 2 up to a predetermined downward depth therein, and is formed to protrude above the upper surface of the semiconductor substrate 2. The region of the semiconductor substrate 2 separated by this element separation film 15 is configured as an element region Sa.

A gate insulating film 3 is formed on the upper surface of the semiconductor substrate 2 in the space between adjacent element separation films 15. A polysilicon film 4 is formed on the gate insulating film 3 between adjacent element separation films 15. This polysilicon film 4 is configured to protrude above the upper surface of the element separation films 15 adjacent to each other in the X-direction. An inter-electrode insulating film 5 is formed along an upper surface of the element separation film 15 and a side surface and an upper surface of the polysilicon film 4. Films 6 to 10 and 12 to 14 illustrated also in FIG. 4A are sequentially formed on the inter-electrode insulating film 5, and the structure of a bit line BL is formed in an upper portion of an inter-layer insulating film 14 which is a top layer.

Next, the structure of the transistor Trp of the peripheral circuit region will be described with reference to FIG. 4C. The transistor Trp of the peripheral circuit region has approximately the same structure as the above-described selection transistor STD. As described above, in the transistor Trp, an element separation region Sbb is formed to surround the element region Saa by processing of the semiconductor substrate 2 (see FIG. 3A), such as by anisotropic etching through a mask. In FIG. 4C, regarding structural elements in the peripheral circuit region, made of the same materials as the structural elements in the memory cell region illustrated in FIG. 4B, the reference numerals 23 to 35 in FIGS. 4C to 4E relate to reference numerals 3 to 15 by adding "20" to the reference numerals 3 to 15 in FIG. 4B, and have the same materials as those corresponding to reference numerals 3 to 15 in FIG. 4B.

In the peripheral circuit region, a gate insulating film 23 is formed on the upper surface of the semiconductor substrate 2. This gate insulating film 23 may be formed to have a different film thickness varying with the type of the transistor Trp. A gate PG is formed on this gate insulating film 23. This gate PG is configured by sequentially depositing, on the gate insulating film 23, a polysilicon film 24, an inter-electrode insulating film 25, polysilicon films 26 and 27, and a metal layer 28, a silicon nitride film 29 and a silicon oxide film 30. The conductivity type of the polysilicon film 24 is, for example, an n-type. The conductivity type of the polysilicon film 24 may alternatively be a p-type.

The gate PG is formed so that an opening is provided in central portions of the polysilicon film 26 and the inter-electrode insulating film 25, and the polysilicon films 26 and 27 and 24 and 27 are brought into contact with each other in the opening. Accordingly, the polysilicon films 24 and 26 are configured to be electrically connected with each other. In the present sectional view, side surfaces of the stacked structure represented by the reference numerals 23 to 30 are flush with each other.

A spacer film 31 is formed on both side surfaces of the stacked structure of the gate insulating film 23, the polysilicon film 24, the inter-electrode insulating film 25, polysilicon films 26 and 27, the metal layer 28, the silicon nitride film 29 and the silicon oxide film 30. The spacer film 31 is formed of, for example, a silicon oxide film. In addition, a silicon oxide film 32 is formed as a first liner film along an upper surface of the element region Saa of the semiconductor substrate 2, a side surface and an upper surface of the spacer film 31, and an upper surface of the silicon oxide film 30. On the upper surface of this silicon oxide film 32, a silicon nitride film 33 is formed as a second liner film.

The inter-layer insulating film 34 is formed over the silicon nitride film 33. The inter-layer insulating film 34 is formed of, for example, silicon oxide. In addition, a low concentration dopant diffusion region 2b is formed in the surface layer portion of the semiconductor substrate 2 on both sides of the gate PG. Furthermore, a high concentration dopant diffusion region 2c is formed in the surface layer portion of the semiconductor substrate 2 on both outer sides of the spacer film 31. These diffusion regions 2b and 2c are configured as a source-drain region of the peripheral transistor Trp.

Over the diffusion regions 2b and 2c of the gate PG formed in the X2-direction, a hole Hc is formed in the silicon oxide film 32, the silicon nitride film 33, and the inter-layer insulating film 34, and an electrode material is embedded in the hole Hc to form contact electrodes CP2 and CP3. The contact electrodes CP2 and CP3 are formed using, for example, a tungsten (W) film over a barrier film made of titanium nitride (TiN). Upper layer wirings Mx and My are formed on the contact electrodes CP2 and CP3, respectively.

Next, a cross-section structure taken along the line 4E-4E of FIG. 3B will be described with reference to FIG. 4E. Similarly, in the cross-section illustrated in FIG. 4E, a gate insulating film 23, a polysilicon film 24, an inter-electrode insulating film 25, polysilicon films 26 and 27, and a metal layer 28 are sequentially formed on the upper surface of the semiconductor substrate 2 to provide approximately the same structure as the gate PG. A silicon nitride film 29 and a silicon oxide film 30 are sequentially formed on this metal layer 28.

In the film layer stack structure thereof, an opening groove MZ is formed in the film layer stack structure extending through inter-electrode insulating film 25, polysilicon films 26 and 27, metal layer 28, silicon nitride film 29 and silicon oxide film 30, and this opening groove MZ extends to, and may extend slightly inwardly of, the upper surface of the polysilicon film 24. Accordingly, a recessed portion 24*a* is formed in the upper surface of the polysilicon film 24. A sidewall spacer film 36 is formed at both edges of the opening groove MZ along the side surfaces of the opening groove MZ. The spacer film 36 is formed of, for example, silicon oxide. Polysilicon is embedded in the opening groove MZ and covers the side surface of the spacer films 36 and the upper surface of the polysilicon film 24, and thus a contact electrode 37 is formed. In other words, the spacer film 36 is formed between a side surface of the contact electrode 37 and the side wall of the groove MZ covering the ends surfaces of the inter-electrode insulating film 25, polysilicon films 26 and 27, metal layer 28, silicon nitride film 29 and silicon oxide film 30.

The contact electrode 37 is made of silicon of the same conductivity type as the polysilicon film 24. That is, when the conductivity type of the polysilicon film 24 is a p-type, the conductivity type of the contact electrode 37 is a p-type. On the contrary, when the conductivity type of the polysilicon film 24 is an n-type, the conductivity type of the contact electrode 37 is an n-type. An upper surface of the contact electrode 37 may be formed to be positioned lower than the upper surface of the silicon oxide film 30 and higher than the lower surface of the silicon oxide film 30.

The spacer film 36 is positioned on both sides of the contact electrode 37 in the X2-direction, and the upper surface of the spacer film 36 protrudes higher than the upper surface of the contact electrode 37. A spacer film 31 is formed on the contact electrode 37 and on the side surface of an upper portion of the spacer film 36. This spacer film 31 is formed of, for example, a silicon oxide film. As described using the above-described cross-section of FIG. 4C, this spacer film 31 is formed along the side wall of the gate insulating film 23, the polysilicon film 24, the inter-electrode insulating film 25, polysilicon films 26 and 27, the metal layer 28, the silicon nitride film 29 and the silicon oxide film 30. Furthermore, similarly, it is also formed along the side wall of the of the gate insulating film 23, the polysilicon film 24, the inter-electrode insulating film 25, polysilicon films 26 and 27, the metal layer 28, the silicon nitride film 29 and the silicon oxide film 30. Here, the spacer film 31 formed in the opening groove MZ is denoted by the reference sign 31-MZ. A lower surface of the spacer film 31-MZ comes into contact with the upper surface of the contact electrode 37.

In addition, a silicon oxide film 32 is formed as a liner film to cover the silicon oxide film 30, the and the spacer film 31MZ covering the portion of the spacer film 36 extending above the contact electrode 37, and the upper surface of the contact electrode 37, and a silicon nitride film 33 is formed over the silicon oxide film 32. Here, in the sectional view of FIG. 4E, the spacer film 31-MZ may be said to be surrounded by the spacer film 36, the contact electrode 37, and the silicon oxide film 32.

An inter-layer insulating film 34 is formed over the silicon nitride film 33. A hole Hd is formed to penetrate through the inter-layer insulating film 34, the silicon nitride film 33, and the silicon oxide film 32 and at least to the contact electrode 37, and an electrode material is embedded in this hole Hd to form a contact electrode VP6. The contact electrode VP6 is formed using, for example, a tungsten (W) film formed over a barrier film made of titanium nitride (TiN). An upper layer wiring Md is formed on this contact electrode VP6.

Here, a first width WX1 in the X2-direction of the contact electrode 37 is formed wider than a second width WX2 in the X2-direction of the contact electrode VP6. As a result, the area of the contact electrode with the overlying line is increased, and thus contact resistance therebetween may be reduced.

Next, a cross-section structure taken along the line 4D-4D of FIG. 3B will be described with reference to FIG. 4D. In the cross-section illustrated in FIG. 4D, a gate insulating film 23 is formed on the upper surface of the semiconductor substrate 2, and on an upper surface of this gate insulating film 23, a polysilicon film 24 is formed. A contact electrode 37 is formed on an upper surface of the polysilicon film 24. In the cross-section illustrated in FIG. 4D, individual film layer stacks of the gate insulating film 23, polysilicon film 24 and contact electrode 37 are spaced from each other in the Y2-direction, and in an intermediate portion therebetween, an element separation film 35 is formed in the upper portion of the semiconductor substrate 2. This element separation film 35 configures the element separation region Sb of FIG. 2.

As illustrated in FIG. 4D, a height H2 of the film stack comprising the polysilicon film 24 and the contact electrode 37 is greater than a height H1 of the film stack of the polysilicon film 24, the inter-electrode insulating film 25, polysilicon films 26 and 27 and the metal layer 28 of the gate MG of the peripheral transistor Trp. A spacer film 31 is formed on side surfaces of the individual film stacks comprising the gate insulating film 23, the polysilicon film 24 and the contact electrode 37. In addition, a silicon oxide film 32 is formed along an upper surface of these film stacks, an upper surface and a side surface of the spacer film 31, the exposed surface of the separation film 35 and the exposed surface of the semiconductor substrate 2 between the separation film 35 and the spacer film 31. Furthermore, a silicon nitride film 33 is formed over the silicon oxide film 32. An inter-layer insulating film 34 is formed on the silicon nitride film 33.

A hole Hd is formed in the inter-layer insulating film 34, the silicon nitride film 33, and the silicon oxide film 32 and at least to the surface of, or inwardly of, the contact electrode 37, and a conductive material is embedded in this hole Hd to form a contact electrode VP6. On this contact electrode VP6, an upper layer wiring Md as a wiring layer is formed. This upper layer wiring Md is formed in the Y2-direction.

An inter-layer insulating film 34 is formed on the silicon nitride film 33. A hole Hd is formed to penetrate through the inter-layer insulating film 34, the silicon nitride film 33, and the silicon oxide film 32 and at least to the surface of, or inwardly of, the contact electrodes 37, and a conductive material is embedded in this hole to form contact electrodes VP3 and VP7. Contact electrode VP7 is overlaid by upper layer wiring Md, and upper wiring layer Mb overlays contact electrode VP3.

Here, a first width WY1 in the Y2-direction of the contact electrode 37 is wider than second widths WY2 in the Y2-direction of the contact electrodes VP3, VP6, and VP7. As a result, the area of the contact electrode is increased, and thus even if the pattern of the contact openings is misaligned, the contact electrodes VP3, VP6 and VP7 will land on the contact electrode 37, and thus contact resistance may be reduced.

Figure 4E:
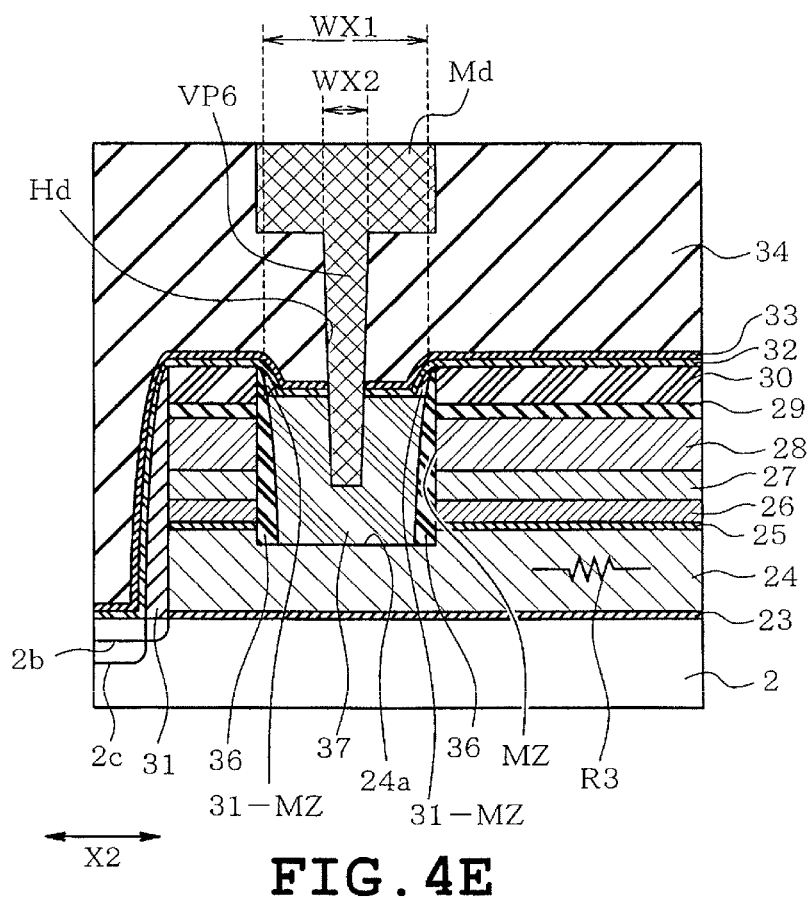
FIG. 4E is a longitudinal sectional view schematically illustrating an example of the structural cross-section of a portion of the memory cell region according to the first embodiment, taken along the line 4E-4E of FIG. 3B.
Figure 6B:
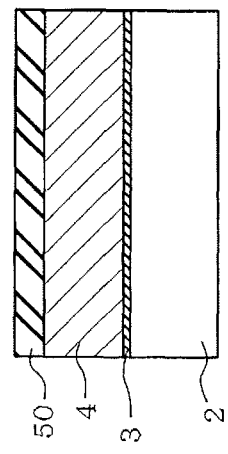
Figure 6D:
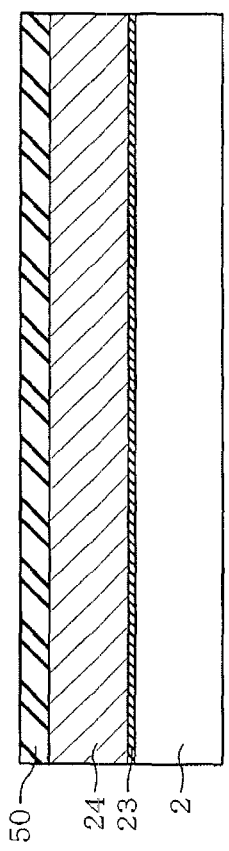
Figure 6A:
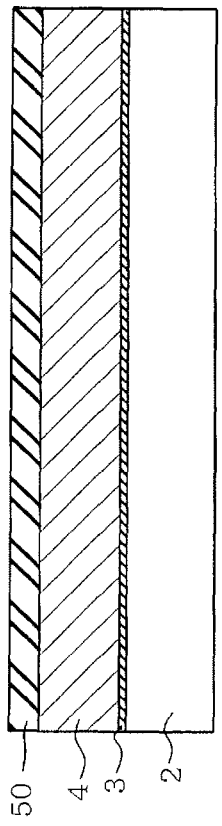
Figure 6C:
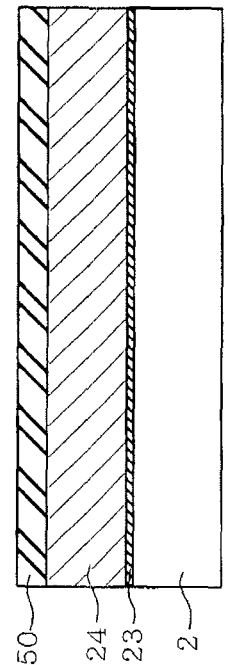
Figure 6E:
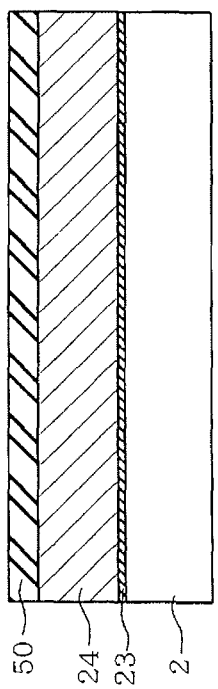

According to this embodiment, as shown in FIG. 4E, since the spacer film 36 is formed between the polysilicon film 26 and the contact electrode 37 connected to the contact electrode VP6, conduction between the contact electrode 37 and the polysilicon film 26 may be prevented, and a resistance element using only the polysilicon film 24 as a resistive element may be obtained.

A method of manufacturing the above-described structure will be described with reference to FIGS. 5A to 24E. In the following description, description will be made focusing on characteristic portions. However, a process may be added between processes if the process to be added is a general process, and if necessary, the following processes may be removed. In addition, the processes may be appropriately replaced if the replacement is practically possible. FIGS. 5A, 6A, 7A, 8A, 9A, 10A, 11A, 12A, 13A, 14A, 21A, 22A, 23A, and 24A are longitudinal sectional views, each of which schematically illustrates an example of the section taken along the line 4A-4A of FIG. 2. FIGS. 5B, 6B, 7B, 8B, 9B, 10B, 11B, 12B, 13B, 14B, 21B, 22B, 23B, and 24B are longitudinal sectional views, each of which schematically illustrates an example of the section taken along the line 4B-4B of FIG. 2. FIGS. 5C, 6C, 7C, 8C, 9C, 10C, 11C, 12C, 13C, 14C, 15A, 16A, 17A, 18A, 19A, 20A, 21C, 22C, 23C, and 24C are longitudinal sectional views, each of which schematically illustrates an example of the section taken along the line 4C-4C of FIG. 3A. FIGS. 5D, 6D, 7D, 8D, 9D, 10D, 11D, 12D, 13D, 14D, 15B, 16B, 17B, 18B, 19B, 20B, 21D, 22D, 23D, and 24D are longitudinal sectional views, each of which schematically illustrates an example of the section taken along the line 4D-4D of FIG. 3B. FIGS. 5E, 6E, 7E, 8E, 9E, 10E, 11E, 12E, 13E, 14E, 15C, 16C, 17C, 18C, 19C, 20C, 21E, 22E, 23E, and 24E are longitudinal sectional views, each of which schematically illustrates the section taken along the line 4E-4E of FIG. 3B.

In the following description, for convenience of description, the same reference numerals and signs as those in the above description of the structure will be given to perform the description. However, it should be noted that the reference numerals 3 to 15 given in the drawings illustrating the memory cell region and the reference numerals 23 to 35 given in the drawings illustrating the peripheral circuit region, respectively differing by "20", denote elements which are formed in approximately the same process or in approximately the same manufacturing stage (which may not be formed in the same manufacturing process).

First, as illustrated in FIGS. 5A to 5E, after a well region or the like (not shown) is formed on the surface layer of a semiconductor substrate 2 by ion implantation, gate insulating films 3 and 23 are formed on the upper surface of the semiconductor substrate 2. As the semiconductor substrate 2, for example, a p-type single crystal silicon substrate is used. As the gate insulating films 3 and 23, for example, silicon oxide films are used. For example, when silicon oxide films are formed as the gate insulating films 3 and 23, these may be formed through a thermal oxidation method of the underlying substrate 2 using a dry $O_2$ process. The thicknesses of the gate insulating film 3 of the memory cell region and the gate insulating film 23 of the peripheral circuit region may be changed according to desired characteristics of the films. However, if they are of the same thickness, they may be grown simultaneously in the same process step As illustrated in FIGS. 6A to 6E, polysilicon films 4 and 24 are formed on the gate insulating films 3 and 23, respectively, using a chemical vapor deposition (CVD) method. At this time, the polysilicon film 4 is formed with p-type dopants (for example, boron (B)) introduced thereinto, and the polysilicon film 24 is formed with n-type dopants (for example, phosphorus (P)) introduced thereinto.

As this forming method, for example, an undoped polysilicon is deposited, then a resist mask (not shown) is formed using a lithography method and dopants are implanted using an ion implantation method to introduce p-type dopants (for example, boron (B)) into the polysilicon film 4. Thereafter, after removing and reapplying a new resist mask, n-type dopants (for example, phosphorus (P)) are introduced into the polysilicon film 24. Again, where the polysilicon films 4 and 24 have the same thickness, they may be formed in the same process step.

As another method, for example, a p-type doped polysilicon film 4 is deposited on the gate insulating film 3, and then the polysilicon film 4 in the region other than the memory cell region is removed. Next, n-type doped polysilicon film 24 is formed, and the n-doped polysilicon film 24 of the memory cell region is then removed. Using this method, the polysilicon film 4 may be formed with p-type dopants (for example, boron (B)) introduced thereinto in the memory cell region, and the polysilicon film 24 may be formed with n-type dopants (for example, phosphorus (P)) introduced thereinto in the peripheral region. Next, a silicon nitride film 50 for forming a hard mask is simultaneously formed on the polysilicon films 4 and 24 using a CVD method.

Figure 7A:
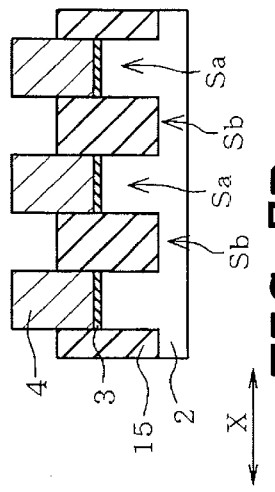
Figure 7B:
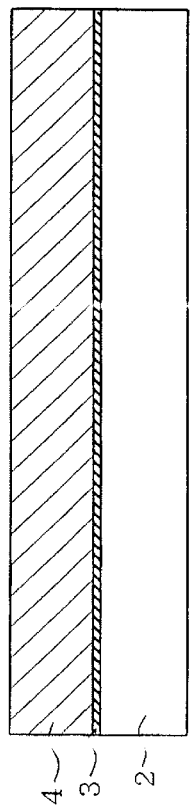
Figure 7C:
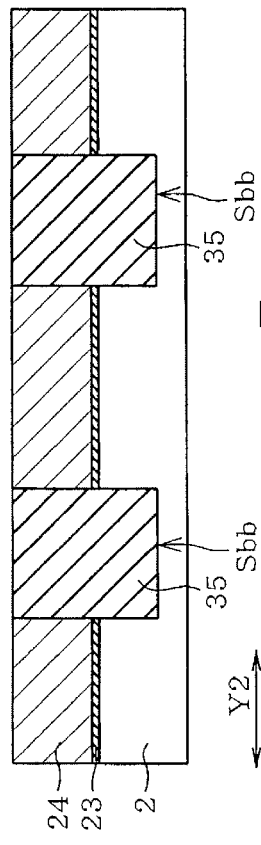
Figure 7D:
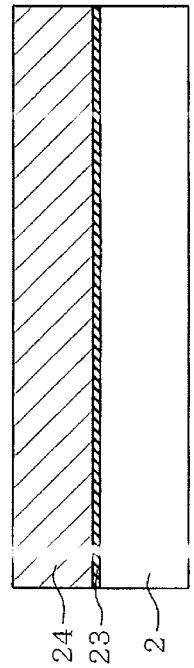
Figure 7E:
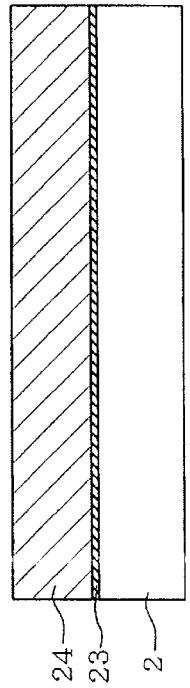
Figure 8A:
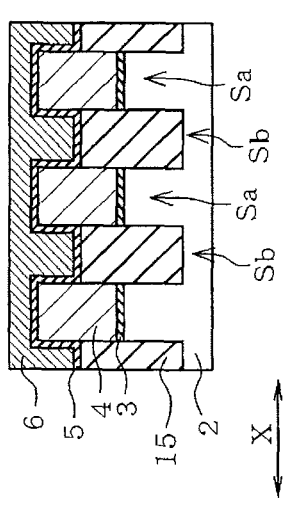
Figure 8B:
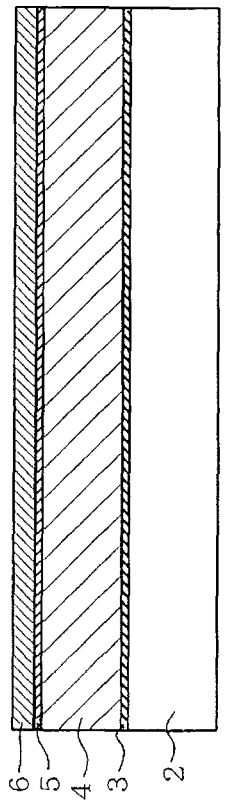
Figure 8C:
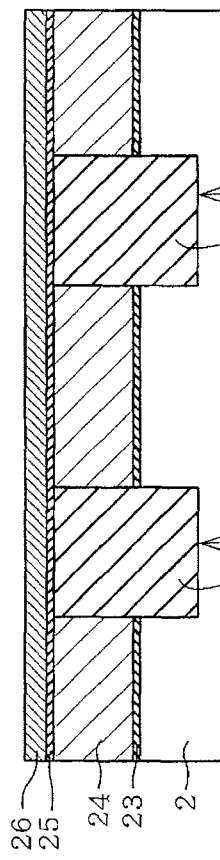
Figure 8D:
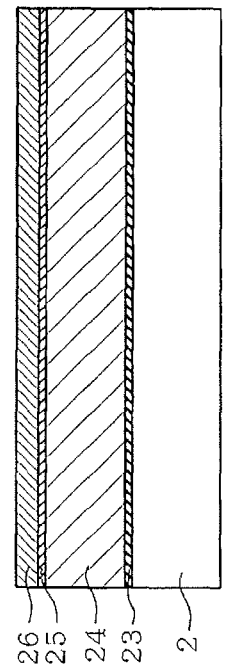
Figure 8E:
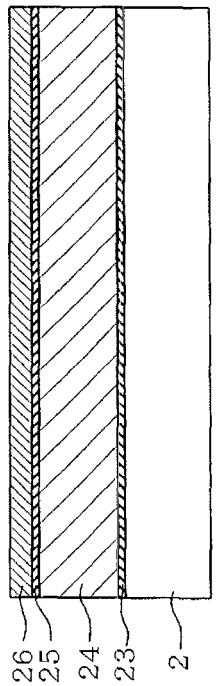
Figure 10A:
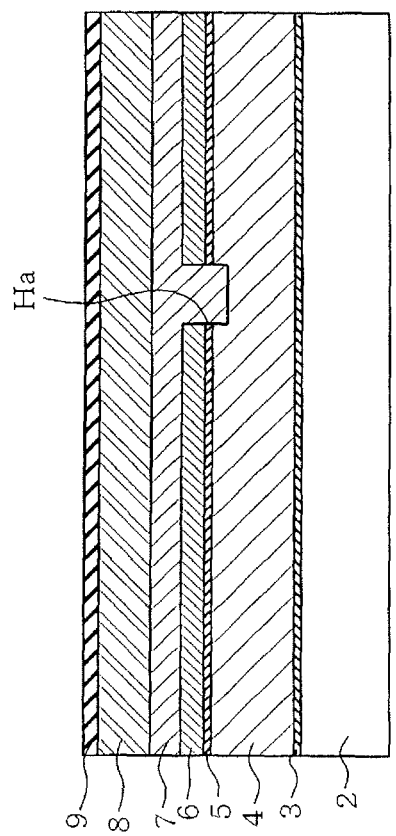
Figure 10B:
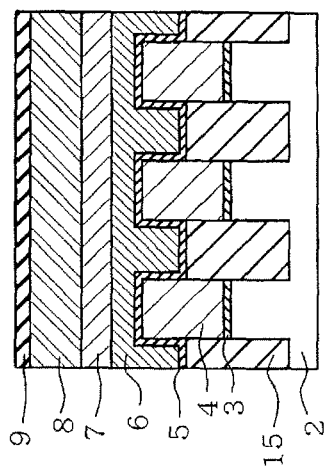
Figure 10C:
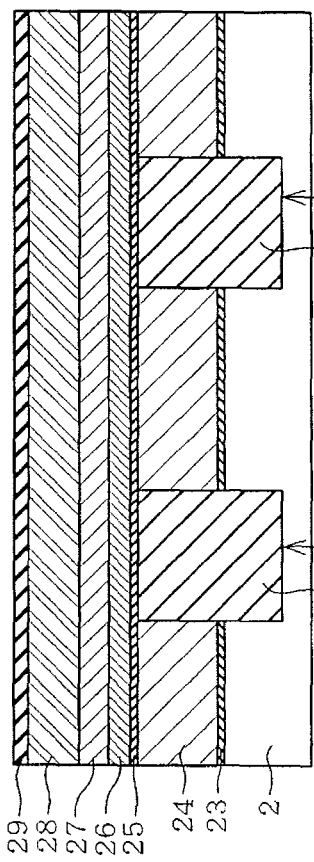
Figure 10D:
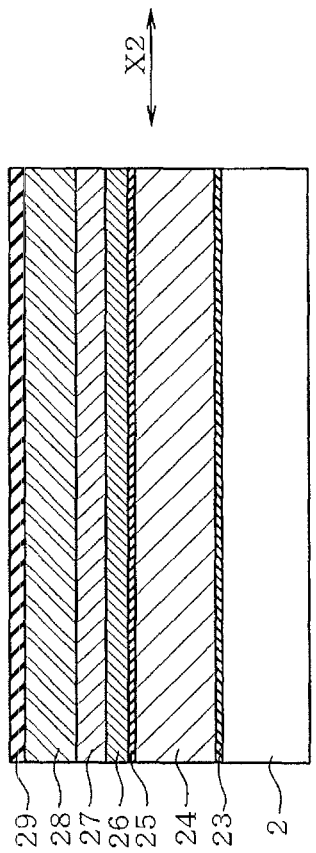
Figure 10E:
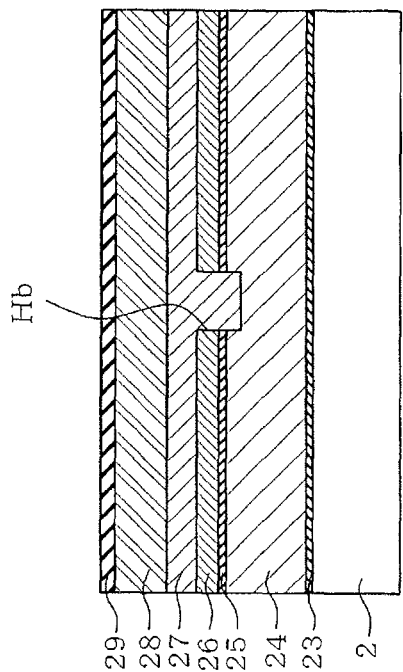

As illustrated in FIGS. 7A to 7E, a resist mask (not shown) for forming element regions Sa and element separation regions Sb is formed using a lithography method, and using this resist mask as a mask, the silicon nitride film 50, the polysilicon films 4 and 24, and the gate insulating films 3 and 23 are anisotropically dry-etched. Thus, the polysilicon films 4 and 24 are patterned and element separation grooves are formed in the surface layer of the semiconductor substrate 2 as shown in FIGS. 7B and 7D.

Element separation films 15 and 35 are formed in the element separation grooves of the semiconductor substrate 2. These element separation films 15 and 35 are simultaneously formed and may be formed using a CVD method or a coating method. Furthermore, the element separation films 15 and 35 are polished using a chemical mechanical polishing (CMP) method up to the position of an upper surface of the silicon nitride film 50 so as to be planarized. This polishing process using the CMP method is performed using the silicon nitride film 50 as a mask, and after the planarization process, the silicon nitride film 50 is removed using a hot phosphoric acid. Thus, element separation regions Sb and Sbb and element regions Sa and Saa are defined.

As illustrated in FIG. 7B, the element separation film 15 of the memory cell region is selectively anisotropically etched back so that an upper surface of the element separation film 15 is formed to be positioned lower than an upper surface of the polysilicon film 4 and higher than a lower surface of the polysilicon film 4. In the peripheral circuit region, this etching-back process is performed using a mask, and thus as illustrated in FIG. 7D, the upper surface of the element separation film 35 of the peripheral circuit region is covered by the mask and thus held approximately flush with the upper surface of the polysilicon film 24.

As illustrated in FIGS. 8A to 8E, inter-electrode insulating films 5 and 25 are formed on the entire surface. The inter-electrode insulating films 5 and 25 may be formed in the same process. In addition, the inter-electrode insulating films 5 and 25 are, for example, ONO films or NONON films. Thereafter, polysilicon films 6 and 26 are formed simultaneously, or separately, on the inter-electrode insulating films 5 and 25, respectively. As for the polysilicon films 6 and 26, once a non-doped polysilicon is formed using a CVD method, then p-type dopants such as boron are implanted into the polysilicon films 6 and 26 through an ion implantation method, and thus the polysilicon films 6 and 26 having the p-type dopants introduced thereinto may be formed. The polysilicon films 6 and 26 may also be formed by depositing a polysilicon using a CVD method while introducing p-type dopants.

As illustrated in FIGS. 9A to 9E, a mask pattern (not shown) for forming an opening in a portion (for example, central portion) of each of gates SGD and SGS of selection transistors STD and STS and in a portion (for example, central portion) of a selection gate PG of a peripheral transistor Trp is formed using a lithography method, and using this mask pattern as a mask, an anisotropic etching process is performed to selectively partially remove the polysilicon films 6 and 26 and the inter-electrode insulating film 5 and 25 (particularly, see FIGS. 9A and 9C). Thus, an opening Ha may be formed in a portion of each of the polysilicon film 6 and the inter-electrode insulating film 5, and an opening Hb may be formed in a portion of each of the polysilicon film 26 and the inter-electrode insulating film 25. The region where the opening Ha (FIG. 10A) is formed is a region where a portion of the selection gate SGD is formed, and the region where the opening Hb is formed is a region where a portion of the transistor Trp is formed.

Next, as illustrated in FIGS. 10A to 10E, p-type polysilicon films 7 and 27 are simultaneously formed in the memory cell region and in the peripheral circuit region. Examples of the method of forming these polysilicon films 7 and 27 include a method including: forming a polysilicon film having no dopants introduced thereinto on the entire surface using a CVD method; and implanting p-type dopants (for example, boron) using an ion implantation method. As another method, for example, a method in which the polysilicon films 7 and 27 are deposited while p-type dopants are introduced may be exemplified. The polysilicon films 7 and 27 are brought into contact with the polysilicon films 4 and 24 through the openings Ha and Hb, respectively, and the polysilicon films 7 and 4 and the polysilicon films 27 and 24 are electrically contacted with each other, respectively.

Furthermore, metal layers 8 and 28 are formed. As for the metal layers 8 and 28, titanium nitride (TiN) may be formed as a barrier film using, for example, a sputtering method, and a tungsten (W) film may be further formed using the sputtering method. The metal layers 8 and 28 may be simultaneously formed. Silicon nitride films 9 and 29 are further formed. The silicon nitride films 9 and 29 may be formed using, for example, a CVD method.

Figures 11A, 11B:
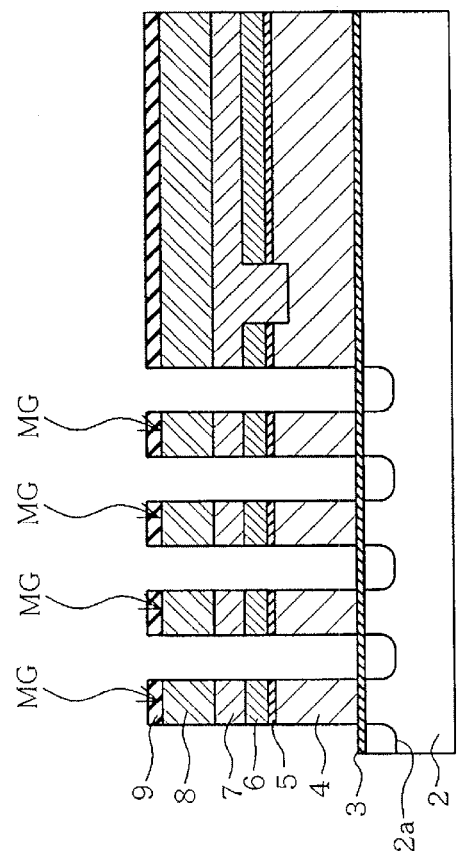
Figure 12B:
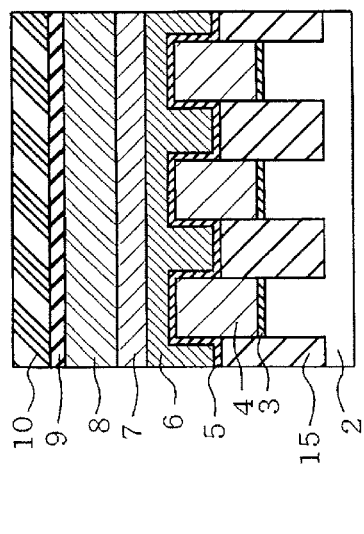
Figure 12A:
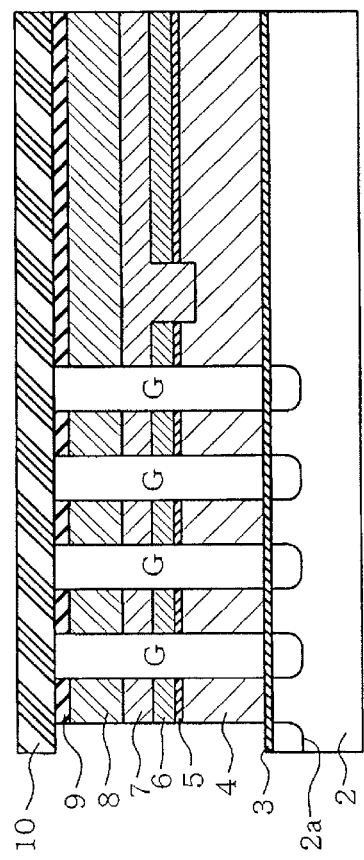

Next, as illustrated in FIGS. 11A to 11E, particularly in FIG. 11A, gates MG of memory cells MT of the memory cell region are created through a lithography method and an anisotropic etching method. A resist mask (not shown) is patterned on the silicon nitride film 9, and using this resist mask as a mask, a dry etching process is anisotropically performed to divide the film stack comprising polysilicon film 4, the inter-electrode insulating film 5, the polysilicon film 6, the polysilicon film 7, the metal layer 8 and the silicon nitride film 9 into individual film stacks to form the individual film stacks for the gates MG. During this etch step, the gate insulating film 3 forms an etch stop such that the semiconductor substrate 2 is not etched into between the gates MG.

By virtue of this process, one side surface of the selection gate SGD (and SGS) on the side thereof facing a gate MG is also formed. In this manufacturing stage, the peripheral circuit region is masked, and is thus not processed (see FIGS. 11C to 11E).

Next, dopants are implanted into the surface layer of the semiconductor substrate 2 between the gates MG and between the gates SGD (and SGS) and MG. For example, when a p-type substrate is used as the semiconductor substrate 2, n-type dopants (for example, phosphorus) may be used as dopants to be implanted into the surface layer of the semiconductor substrate 2. The introduced dopants are heat-treated so as to form as a source-drain region 2a.

Next, as illustrated in FIGS. 12A to 12E, silicon oxide films 10 and 30 are formed on the silicon nitride film 9. The silicon oxide films 10 and 30 may be simultaneously formed in the memory cell region and in the peripheral circuit region using, for example, a CVD method. In this case, the formation of the silicon oxide films 10 and 30 may be performed so that a plurality of layers is formed in a plurality of stages by changing conditions of film forming gas.

For example, using oxide films with poor coatability formed through a plasma CVD method, the silicon oxide films 10 and 30 are simultaneously formed in the memory cell region and in the peripheral circuit region. In order to increase the integration degree, the intervals between the gates MG of the memory cells MT and between the gate SGD of the selection transistor STD and the gate MG of the memory cell MT are made narrow. Therefore, it is difficult to deposit the silicon oxide film 10 in the etched regions between the gates MG and SGD (and SGS) and between the individual gates MG, and thus the silicon oxide film 10 forms a cap over the silicon nitride film 9 and the openings between the gates MG and SGD (and SGS) and between the gates MG.

As a result, an air gap G in which the insulating film 10 is not buried may be formed between the individual gates MG of the memory cells MT and between the gate SGD (and SGS) of the selector transistor STD and the gate MG of the memory cell MT. When this air gap G is formed, an inter-wiring capacitance between adjacent gates MG and a capacitance between the gate MG and the semiconductor substrate 2 may be reduced. Accordingly, unintended actuation caused by inter-cell interference between the memory cells MT may be suppressed, and thus wiring delay may be suppressed. The gate insulating film 3 between the gates MG may be or may not be removed during the step of forming the openings.

As illustrated in FIGS. 13A to 13E, particularly in FIG. 13A, a resist mask (not shown) is patterned on the silicon oxide films 10 and 30 using a lithography method, and using this resist mask as a mask, the film stack of the Gate insulating film 3, polysilicon film 4, the inter-electrode insulating film 5, the polysilicon film 6, the polysilicon film 7, the metal layer 8, the silicon nitride film 9 and silicon oxide film 10 of a region WR1 (also see FIG. 2) where a bit line contact electrode CB (including a source line contact electrode CS) is formed is subjected to anisotropic etching using a RIE method. Thus, the surface of the semiconductor substrate 2 in the region WR1 is exposed (Compare FIG. 12A and FIG. 13A). In this case, the region where the memory cells MT are configured and the peripheral circuit region are masked by the resist mask, and are thus not etched (see FIGS. 13B to 13E).

Figures 14A, 14B:
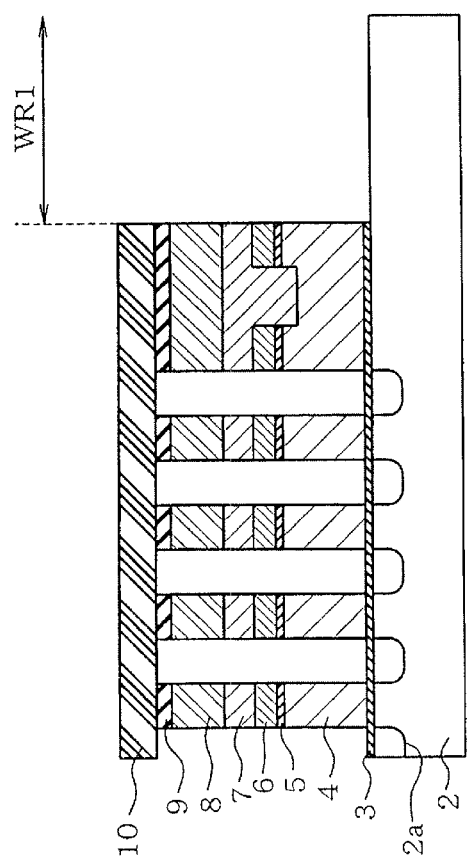
Figure 14C:
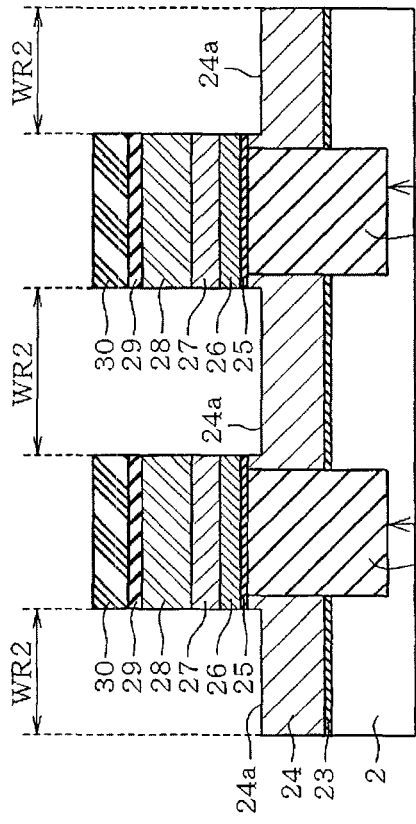
Figure 14D:
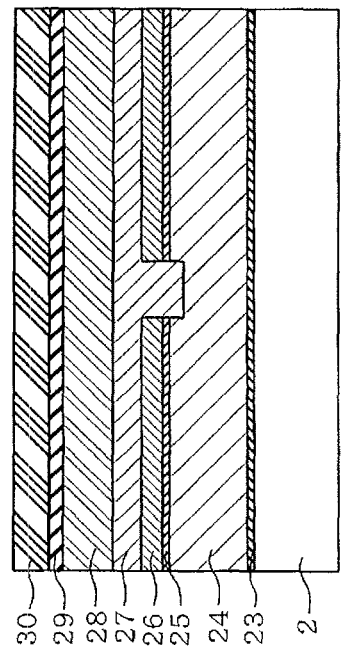
Figure 14E:
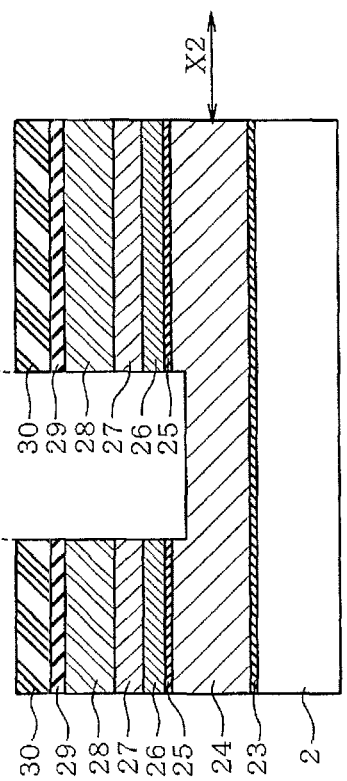

As illustrated in FIGS. 14A to 14E, particularly in FIGS. 14D and 14E, a resist mask (not shown) is patterned on the silicon oxide film 30 using a lithography method so that open regions WR2 are formed, and using this resist mask as a mask, the film stack comprising the inter-electrode insulating film 25, polysilicon films 26 and 27, the metal layer 28, the silicon nitride film 29 and the silicon oxide film 30 and the upper portion of the polysilicon film 24 in the region WR2 are subjected to anisotropic etching to form recessed portions 24a in the upper portion of the polysilicon film 24. This process is performed to expose the upper surface of the polysilicon film 24 configuring lower portions of resistance elements R1 to R6. Here, the regions WR2 are positioned between the element separation films 35 in the Y2-direction. Therefore, the recessed portions 24a are formed only in the upper portion of the polysilicon film 24 at locations between the element separation films 35 without etching into the element separation films 35. In addition, the resist mask is removed through an asking process. In this case, the memory cell region is masked, and is thus not etched (see FIGS. 14A and 14B).

FIGS. 15 to 20 illustrate processes having no effect on the final shape of the memory cell region, and thus a sectional view of the memory cell region is omitted therein. As illustrated in FIGS. 15A to 15C, particularly in FIGS. 15B and 15C, a spacer film 36 is formed. This spacer film 36 is formed using, for example, a silicon oxide film. It may be formed by deposition into a uniform film thickness of silicon oxide on the entire surface using a LPCVD method using, for example, TEOS gas, and by then performing an anisotropic etching-back. In addition, this spacer film 36 may also be formed using, for example, a silicon nitride film. Accordingly, this spacer film 36 is formed along inner side surfaces of the film stack the inter-electrode insulating film 25, polysilicon films 26 and 27, the metal layer 28, the silicon nitride film 29 and the silicon oxide film 30 and the upper portion of the polysilicon film 24 adjacent the sidewall of the etched opening in the region WR2. Although not illustrated in the drawings, in this case, once the spacer film 36 of the memory cell region is formed, then it is removed by the overall etching-back process. Thus, the spacer film 36 does not remain in the peripheral region.

As illustrated in FIGS. 16A to 16C, a polysilicon film 37a as a material for forming a contact electrode 37 is formed on the entire surface. This polysilicon film 37a is formed by depositing undoped polysilicon using a CVD method and by implanting, for example, n-type dopants using an ion implantation method. Otherwise, for example, the polysilicon film 37a may be deposited while n-type dopants are introduced thereinto. For example, when the polysilicon film 24 is a p-type, the formed polysilicon film 37a is also a p-type. In this case, after deposition of a undoped polysilicon, p-type dopants are implanted in place of the n-type dopants. Otherwise, the polysilicon film 37a may be deposited while p-type dopants are introduced thereinto. At this time, the polysilicon film 37a is formed so that the position of an upper surface thereof is higher than positions of the upper surfaces of the spacer film 36 and the silicon oxide film 30. Accordingly, the polysilicon film 37a to form the contact electrode 37 may be completely embedded in the region WR2 between the spacer films 36. Although not illustrated in the drawings, in this manufacturing stage, a polysilicon film 37a is formed also in the memory cell region in the same manner. After deposition of the polysilicon film 37a, an upper surface of the polysilicon film 37a may be planarized using a CMP method.

Figure 17C:
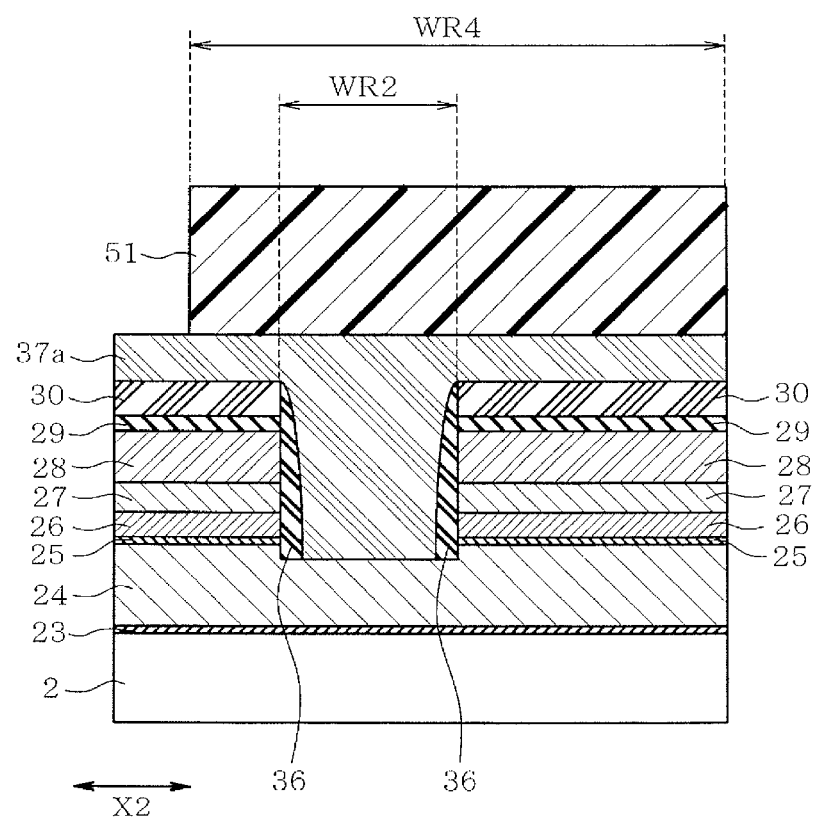
Figure 18C:
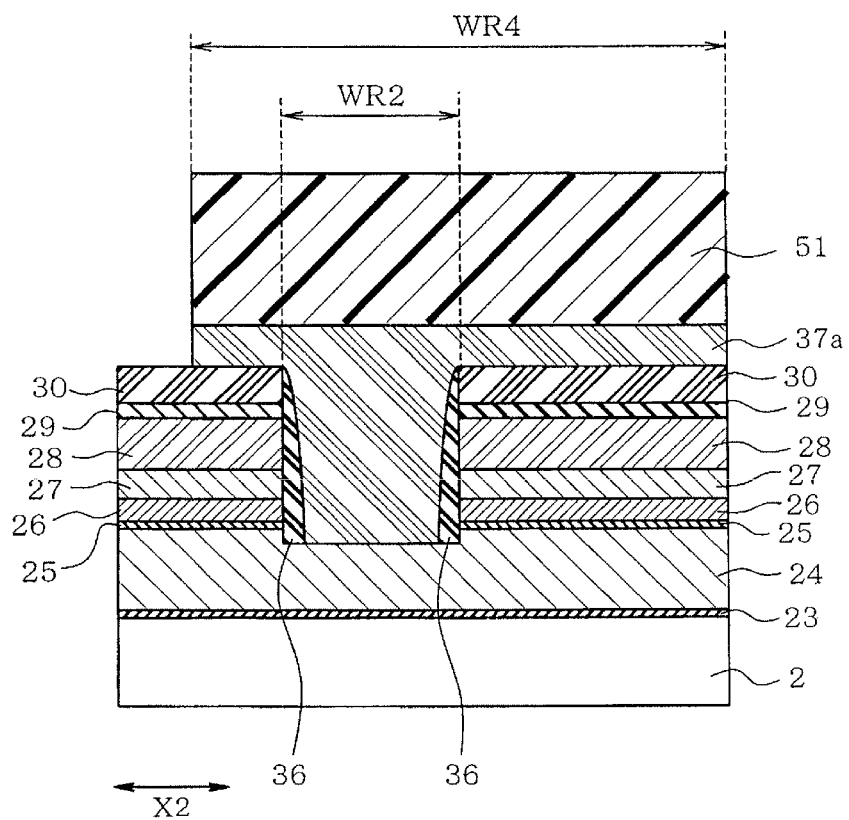

As illustrated in FIGS. 17A to 17C, a resist mask 51 is formed on the upper surface of the polysilicon film 37a. This resist mask 51 is patterned on the upper surface of the polysilicon film 37a so as to simultaneously cover regions WR3 where the gate PG of the peripheral transistor Trp of the peripheral circuit region is formed and regions WR4 where the resistance elements R1 to R6 are formed. Here, the resist mask 51 is disposed over the recessed portions 24a in the Y2-direction. Therefore, the recessed portions 24a are formed only in the upper portion of the polysilicon film 24 without etching of the element separation films 35. In the Y2-direction, a relationship of the distance between the element separation films 35 adjacent to each other>the width of the region WR2>the width of the forming region WR4 is formed. In the memory cell region, the resist mask is removed during patterning of the peripheral region. As illustrated in FIGS. 18A to 18C, the polysilicon film 37a is subjected to anisotropic etching by a RIE method using the resist mask 51 as a mask. This etching process is performed under the condition where the polysilicon film 37a may be subjected to a highly selective etching process with respect to the silicon oxide film 30 (and 10). In this processing stage, although not illustrated in the drawings, the polysilicon film 37a is removed in the memory cell region. In addition, the resist mask 51 is removed by asking.

As illustrated in FIGS. 19A to 19C, the silicon oxide film 30, the silicon nitride film 29, and the metal layer 28 are subjected to anisotropic etching using the polysilicon film 37a as a mask under a changed etching process condition (etching selectivity condition). At this time, a condition where the spacer film 36 formed along the side wall of the lamination structure ranging from the reference numerals 28 to 30 is also simultaneously removed as illustrated in FIG. 19B may also be used.

As illustrated in FIGS. 20A to 20C, an etching process is performed under a further changed etching process condition. This etching process is performed by highly selectively condition processing the polysilicon film 37a with respect to the materials of the silicon oxide film 30 and the spacer film 36. As a result, the polysilicon films 27, 26, and 24 in the region other than the region WR4 illustrated in FIG. 19C are also simultaneously removed. The spacer film 36 formed in the memory cell region is removed during this process.

The inter-electrode insulating film 25 and the gate insulating film 23 in the region other than the region WR4 are formed thinner than the polysilicon films 27, 26, and 24. Accordingly, as illustrated in FIG. 20C, the inter-electrode insulating film 25 and the gate insulating film 23 are also removed together when the polysilicon films 37, 27, 26, and 24 are etched back. Finally, the etching process is performed until the film stack comprising the metal layer 28, the silicon nitride film 29 and the silicon oxide film 30 and the polysilicon film 24 in the region other than the region WR4 are removed. In FIG. 20B, the upper surface of the element separation film 35 is flush with the upper surface of the semiconductor substrate 2, but is not limited thereto.

In addition, the etching process is performed under the condition where the polysilicon film 37a is poorly etched with respect to the materials of the silicon oxide film 30 and the spacer film 36. Therefore, the position of the upper surface of the polysilicon film 37a may be adjusted to be positioned between the upper surface and the lower surface of the silicon oxide film 30. Thus, the polysilicon film 37a is processed into the contact electrode 37.

Figure 21B:
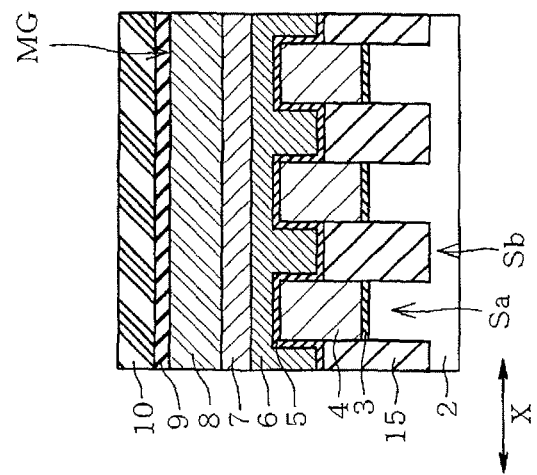
Figure 21A:
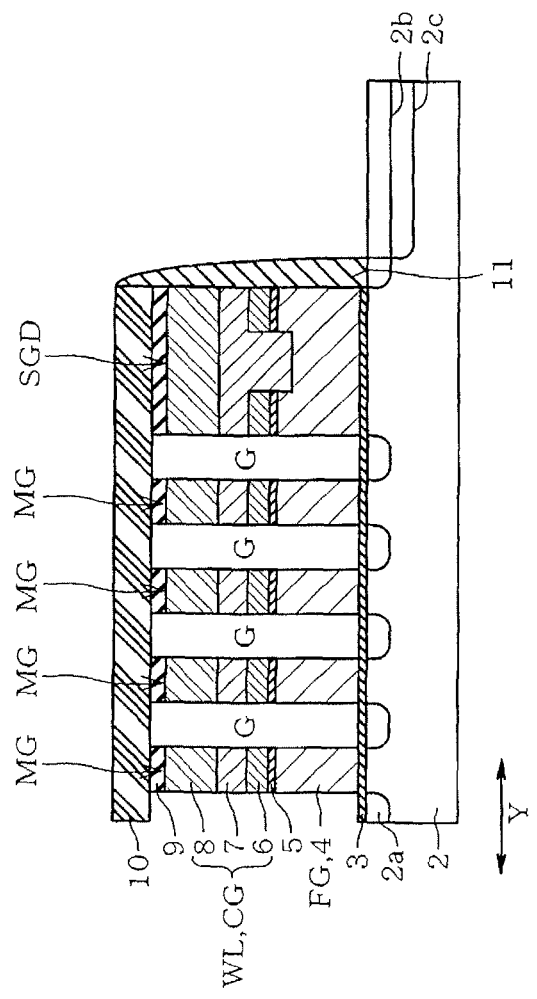
Figure 23E:
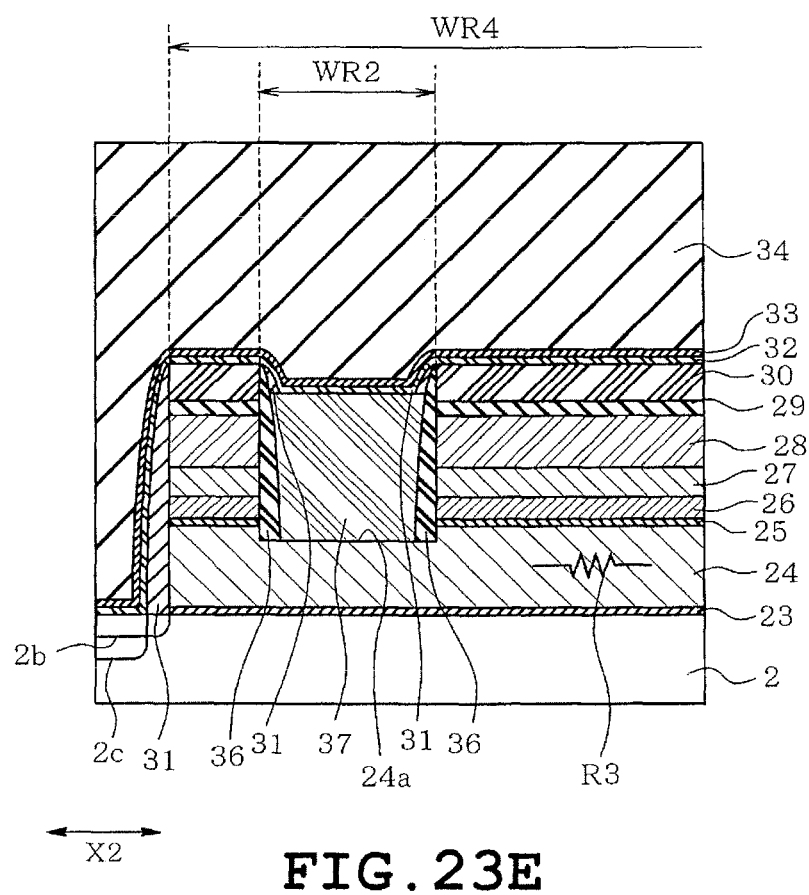

As illustrated in FIGS. 21A to 21E, spacer films 11 and are formed. These spacer films 11 and 31 may be simultaneously formed in the memory cell region and in the peripheral circuit region by deposition of a uniform film thickness film on the entire surface using a LPCVD method using, for example, TEOS gas, and by then performing overall etching-back. Accordingly, as illustrated in FIG. 21A, the spacer film 11 is formed along a side surface of the film stack comprising gate insulating film 3, polysilicon film 4, the inter-electrode insulating film 5, the polysilicon film 6, the polysilicon film 7, the metal layer 8, the silicon nitride film 9 and the silicon oxide film 10 including in the selection gate SGD. Furthermore, as illustrated in FIG. 21C, the spacer film 31 is formed along both side surfaces of the film stack comprising the inter-electrode insulating film 25, polysilicon films 26 and 27, the metal layer 28, the silicon nitride film 29 and the silicon oxide film 30 including in the gate PG in the region WR3. Furthermore, as illustrated in FIG. 21D, the spacer film 31 is formed on the side surfaces of the gate insulating film 23, the polysilicon film 24, and the contact electrode 37 in the region WR4. Furthermore, as illustrated in FIG. 21E, the spacer film 31 is formed along the upper inner side of the spacer film 36 in the region WR2 on the upper surface of the contact electrode 37.

As illustrated in FIGS. 22A to 22E, a silicon oxide film 12 is formed as a first liner film on the entire surface, and a silicon nitride film 13 is formed as a second liner film on the entire surface. The silicon oxide film 12 is formed using, for example, a CVD method, and is formed along the upper surface of the element region Saa of the semiconductor substrate 2, the side surface and the upper surface of the spacer film 31, and the upper surface of the silicon oxide film 30. The silicon nitride film 13 is formed using, for example, a CVD method, and is formed on the silicon oxide film 12.

As illustrated in FIGS. 23A to 23E, an inter-layer insulating film 34 is formed on the silicon nitride film 13. This inter-layer insulating film 34 may be formed using, for example, a CVD method using a silicon oxide film. An upper surface of this inter-layer insulating film 34 may be planarized using, for example, a CMP method.

As illustrated in FIGS. 24A to 24E, a resist mask (not shown) is formed on the inter-layer insulating film 34, and is patterned to have an opening at a position corresponding to each of contact electrodes CP2, CP3, VB1 to VB10, and CB. Next, holes Hc are etched into the inter-layer insulating film 34 using the silicon nitride film 33 as an etch stop. Thereafter, the holes Hc are etched to reach the semiconductor substrate 2. At this time, when holes Hc of bit line contact electrodes CB (including the source line contact electrode CS), a gate contact CP1, contact electrodes CP2 and CP3 which are intended to contact the substrate, and holes Hd for embedding of the contact electrodes VP1 to VP10 which reach only to or into an electrode 37 for the resistance elements are simultaneously formed, a target depth of the hole Hc for the bit line contact electrode CB and the contact electrodes CP2 and CP3 is different from a target depth of the hole Hd for embedding of the gate contact CP1 and the contact electrodes VP1 to VP10.

However, where the contact electrode 37 is not formed on the polysilicon film 24, the hole Hd may penetrate through the polysilicon film 24 and may reach the upper surface of the semiconductor substrate 2. When the etching process is performed up to the upper surface of the semiconductor substrate 2, the contact electrodes VP1 to VP10 could come into contact with the semiconductor substrate 2, causing device failure in that region. To prevent this, one would need to separately etch the openings for contact electrodes VP 1 to 10 and the contact electrodes CP, etc. which are intended to contact the substrate, which requires an extra set of masking patterning and stripping steps, as well as two different electrode fill steps.

Figure 24E:
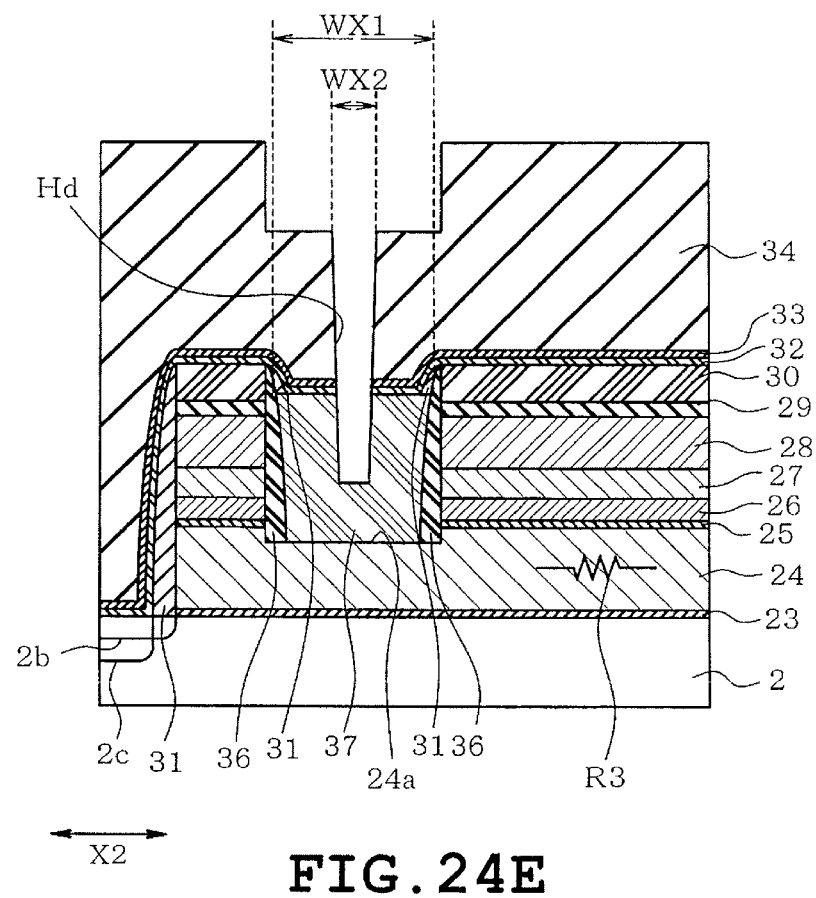

In this embodiment, in this manufacturing stage, as illustrated in FIGS. 24D and 24E, because the contact electrode 37 is formed on the polysilicon film 24, when the anisotropic etching process is performed by employing a condition where the inter-layer insulating film 34 has high etching selectivity with respect to the contact electrode 37 and the polysilicon film 24, the hole Hd is less likely to reach the semiconductor substrate 2, and thus a margin for processing of the hole Hc may be improved (process window enlarged). As illustrated in FIGS. 24D and 24E, the hole Hd may not stop at the upper surface of the contact electrode 37, but may be eroded up to the central portion therebelow.

As illustrated in FIGS. 4A to 4E, a conductive material is embedded in the holes Hc simultaneously with embedding of a conductive material in the holes Hd. As a result, the bit line contact electrode CB, the contact electrodes CP2 and CP3, and the contact electrodes VP1 to VP10 may be formed simultaneously. The contact electrodes CB, CP2, and CP3 and the contact electrodes VP1 to VP10 are formed through a sputtering method using a metal film which is, for example, a tungsten (W) film over a sputtered barrier film made of titanium nitride (TiN). Thereafter, bit lines BL and upper layer wirings Ma to Mf, Mx, and My as wiring layers are formed on the contact electrodes CB, CP2, and CP3 and on the contact electrodes VP1 to VP10, respectively.

According to this embodiment, a hole reaching the polysilicon film 24 is formed in the region WR2, and then the polysilicon film 37a is embedded again in the region WR2, and thus the distance from the upper surface of the semiconductor substrate 2 to the contact electrode 37 may be increased. Thus, even when at least two or more holes Hc and Hd for formation of the various contact electrodes CB, CP2, and CP3 and the contact electrodes VP1 to VP10 are simultaneously formed, it is possible to reduce the possibility that the holes Hd for formation of the contact electrodes VP1 to VP10 reach the upper surface of the semiconductor substrate 2. Accordingly, a margin (process window) for processing of the hole Hd may be improved.

Second Embodiment

Figures 25C, 25D:
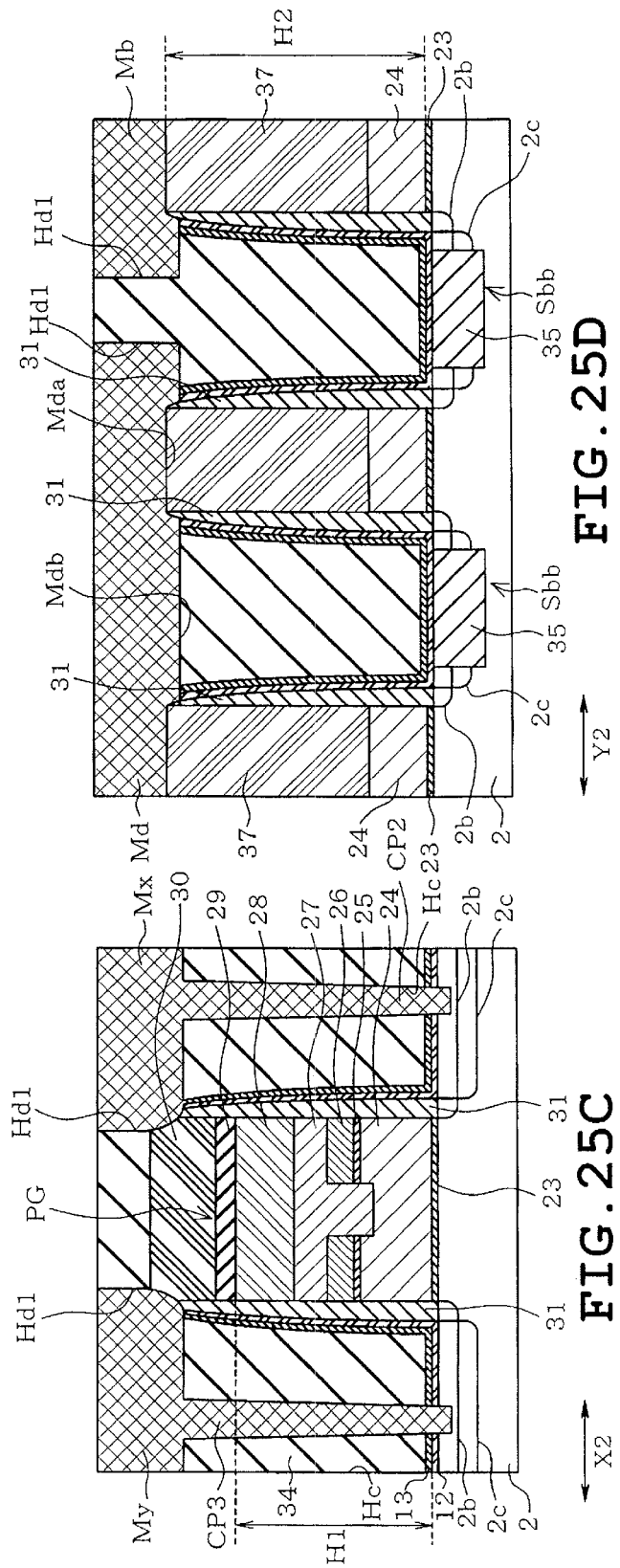
FIG. 25C is a longitudinal sectional view schematically illustrating an example of a structure of a peripheral transistor of a peripheral circuit region according to the second embodiment, taken along the line 4C-4C of FIG. 3A.
FIG. 25D is a longitudinal sectional view schematically illustrating an example of a structure of a resistance element of the peripheral circuit region according to the second embodiment, taken along the line 4D-4D of FIG. 3B.
Figure 25E:
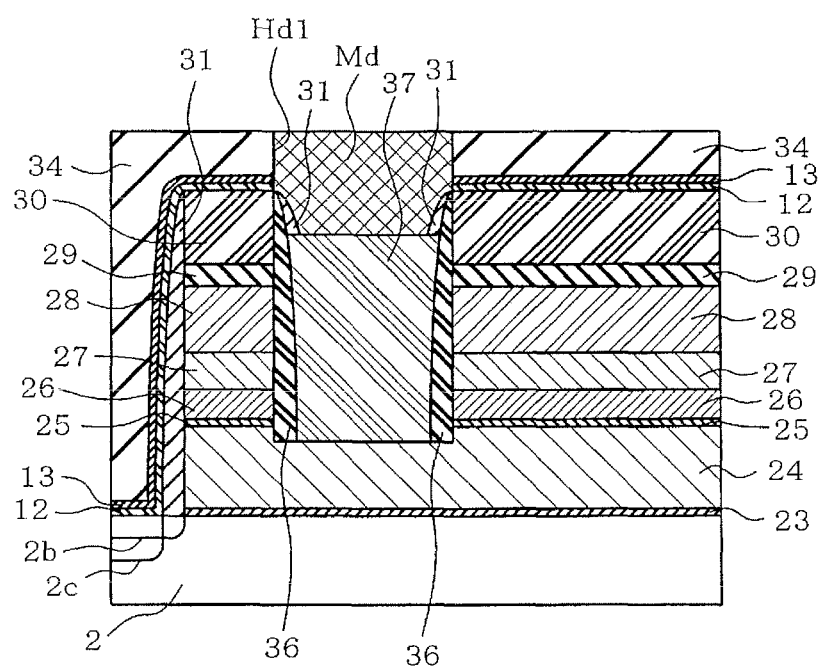
FIG. 25E is a longitudinal sectional view schematically illustrating an example of the structure of the resistance element of the peripheral circuit region according to the second embodiment, taken along the line 4E-4E of FIG. 3B.

FIGS. 25A to 25E illustrate a second embodiment. FIG. 25A is an example of a sectional view taken along the line 4A-4A of FIG. 2. FIG. 25B is an example of a sectional view taken along the line 4B-4B of FIG. 2. FIG. 25C is an example of a sectional view taken along the line 4C-4C of FIG. 3A. FIG. 25D is an example of a sectional view taken along the line 4D-4D of FIG. 3B. FIG. 25E is an example of a sectional view taken along the line 4E-4E of FIG. 3B. As illustrated in FIGS. 25A to 25E, particularly in FIG. 25D, a self-alignment process is employed, and upper layer wirings Ma to Mf are formed to be brought into direct contact with an upper surface of a contact electrode 37. That is, the upper layer wirings Ma to Mf are formed to be brought into contact with the upper surface of the contact electrode 37.

Here, in the formation of holes Hd1 for configuration of upper layer wirings Mx, My, and Ma to Mf, when a position of the upper surface of the contact electrode 37 is low, a bottom portion of the hole Hd1 may reach an upper surface of a conductive film stack comprising the polysilicon film 24, the inter-electrode insulating film 25, polysilicon films 26 and 27 and the metal layer 28 of the gate PG as illustrated in FIG. 25C. However, by adjusting a time which is required for the formation of the hole Hd1, a depth of the hole Hd1 may be adjusted so that the hole Hd1 is deeper than a lower surface of a silicon oxide film 30. Accordingly, the bottom portion of the hole Hd1 does not reach a side surface of the metal layer 28 of the gate PG, and thus a distance between the side surface of the metal layer 28 and the upper layer wiring Mx may be increased. As a result, insulating characteristics between the upper layer wirings Mx and My and the gate PG may be maintained.

In addition, when the self-alignment process is employed, the hole Hd1 for configuration of the upper layer wirings Ma to Mf is formed along the upper inner side of a spacer film 31 as illustrated in FIG. 25E, and thus reaches the upper surface of the contact electrode 37. The upper layer wirings Ma to Mf are embedded in the holes Hd1. Thus, the upper layer wirings Ma to Mf are brought into contact with the upper surface of the contact electrode 37 and may form an electrical conduction state.

According to this embodiment, the upper layer wiring Md is formed along an upper side surface of a spacer film 36, and is brought into contact with the upper surface of the contact electrode 37. The upper layer wiring Md is securely brought into contact with the upper surface of the contact electrode 37.

In an X2-direction, a width of the upper layer wiring Md in an upper end of the spacer film 36 is wider than a width of the upper surface of the contact electrode 37. A width of the upper surface of the contact electrode 37 exposed from the spacer film 31 is equal to a width of the upper layer wiring Md in a lower surface of the spacer film 36.

When comparing a first lower surface Mda where the upper layer wiring Md is brought into contact with the contact electrode 37 with a second lower surface Mdb where the upper layer wiring Md is not brought into contact with the contact electrode 37, at least a portion of the lower surface Mdb is positioned lower than the lower surface Mda. The reason is that an inter-layer insulating film 34 is etched under the condition where the inter-layer insulating film 34 has high etching selectivity with respect to the polysilicon. Accordingly the upper layer wiring Md may be securely brought into contact in the region where the inter-layer insulating film 34 is removed.

In addition, while maintaining insulating characteristics of the structural materials (metal layer 28 and polysilicon film 27) of the upper layer wirings Mx and My and the gate PG, the respective upper layer wirings Ma to Mf may be brought into contact with the upper surface of the contact electrode 37, and thus desired electrical connection may be made.

Third Embodiment

Figure 26B:
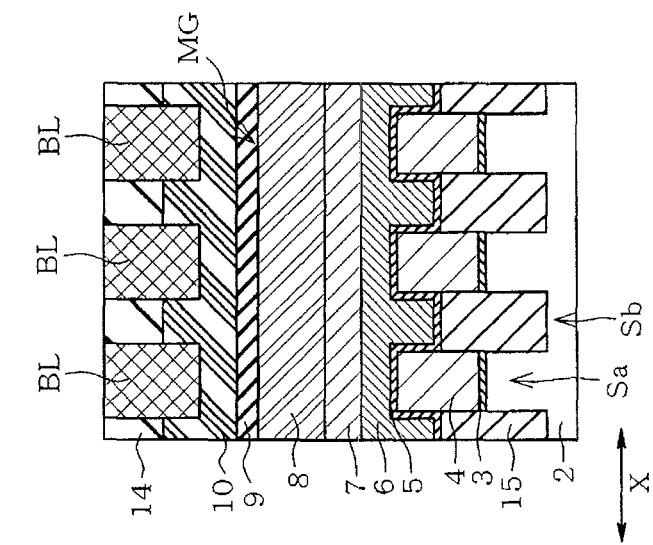
FIG. 26B is a longitudinal sectional view schematically illustrating an example of the structural cross-section of a portion of the memory cell region according to the third embodiment, taken along the line 4B-4B of FIG. 2.
Figure 26A:
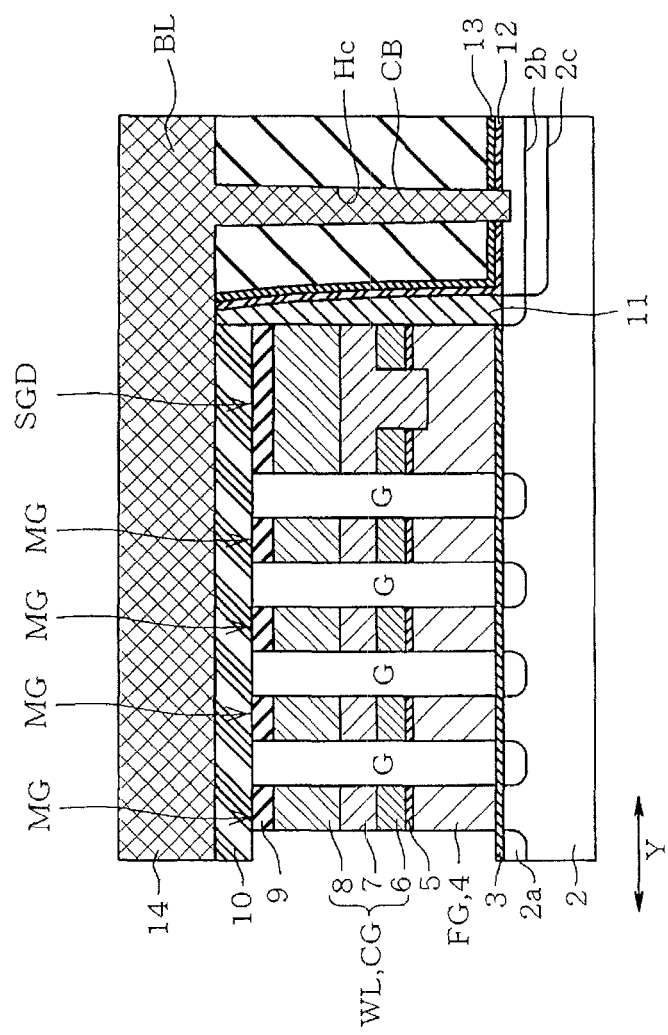
FIG. 26A is a longitudinal sectional view schematically illustrating an example of the structural cross-section of a portion of a memory cell region according to a third embodiment, taken along the line 4A-4A of FIG. 2.
Figure 26E:
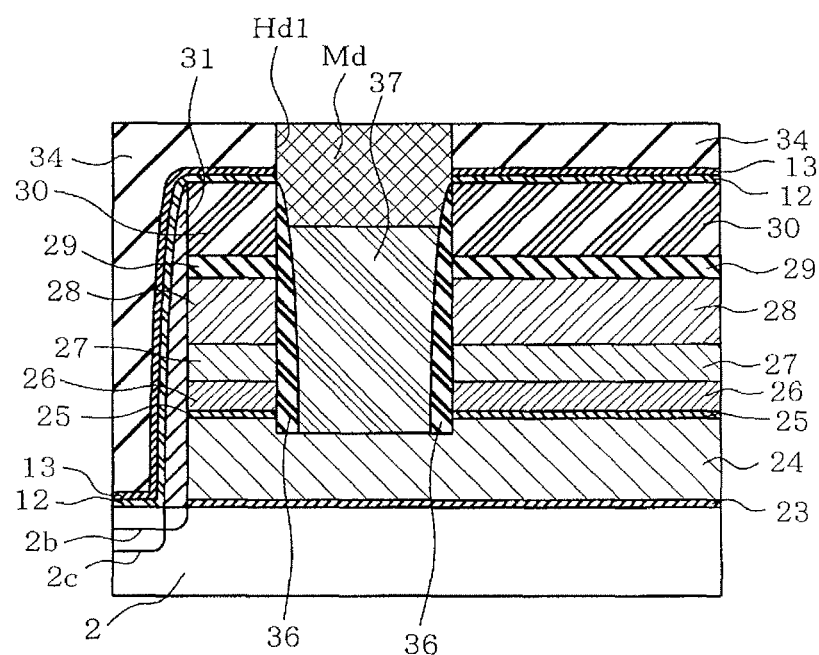
FIG. 26E is a longitudinal sectional view schematically illustrating an example of the structure of the resistance element of the peripheral circuit region according to the third embodiment, taken along the line 4E-4E of FIG. 3B.

FIGS. 26A to 26E illustrate a third embodiment. FIG. 26A is an example of a sectional view taken along the line 4A-4A of FIG. 2. FIG. 26B is an example of a sectional view taken along the line 4B-4B of FIG. 2. FIG. 26C is an example of a sectional view taken along the line 4C-4C of FIG. 3A. FIG. 26D is an example of a sectional view taken along the line 4D-4D of FIG. 3B. FIG. 26E is an example of a sectional view taken along the line 4E-4E of FIG. 3B. As illustrated in FIGS. 26C to 26E, particularly in FIG. 26D, a self-alignment process is employed without provision of contact electrodes VP1 to VP10 (in the drawings, the contact electrodes VP3, VP6, and VP7), and holes Hd1 for configuration of upper layer wirings Mx, My, and Ma to Mf are formed.

Here, in an X2-direction, a width of the upper layer wiring Md in an upper end of a spacer film 36 is wider than a width of an upper surface of a contact electrode 37. The width of the upper surface of the contact electrode 37 is equal to a width of the upper layer wiring Md in a lower surface of the spacer film 36.

In addition, when the self-alignment process is employed, the hole Hd1 for configuration of the upper layer wirings Ma to Mf may be formed along the upper inner side of the spacer film 36 as illustrated in FIG. 26E, because the spacer film 31 is removed. In such an embodiment, the upper layer wirings Ma to Mf are embedded in the holes Hd1. Thus, the upper layer wirings Ma to Mf are brought into contact with the upper surface of the contact electrode 37 and may provide an electrical conduction.

Fourth Embodiment

Figure 27:
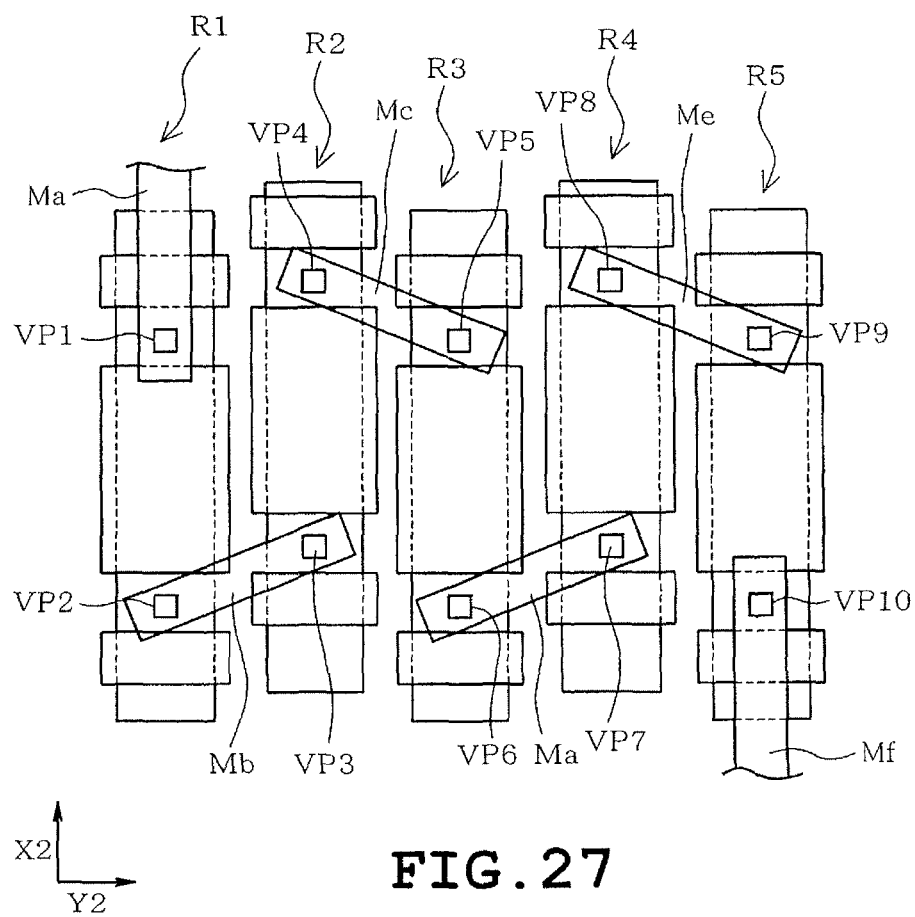
FIG. 27 is a plan view schematically illustrating an example of structures of resistance elements of a peripheral circuit region according to a fourth embodiment.

FIG. 27 illustrates a fourth embodiment. FIG. 27 is a plan view corresponding to FIG. 3B, and illustrates an example of a layout of resistance elements R1 to R5 of a peripheral circuit region. The resistance elements R1 to R5 are disposed to be spaced from each other in a Y2-direction and offset or staggered in the X2 direction. As shown in the above-described embodiments, each of the resistance elements R1 to R5 is provided so that a contact electrode 37 to be a structural element is disposed as a first electrode and contact electrodes VP1 to VP10 are disposed as second electrodes on the contact electrode 37.

The contact electrode 37 and the contact electrodes VP1 to VP10 are disposed in a zig-zag manner in the X2- and Y2-directions. Accordingly, the contact electrode 37 and the contact electrodes VP1 to VP10 adjacent to each other in the Y2-direction are shifted in the X2-direction. As a result, when the contact electrode 37 and a polysilicon film 24 are divided, even when the film remainder is generated on a side of the contact electrode 37 in the Y2-direction, the resistance of the polysilicon film (contact electrode 37) remaining between the resistance elements R1 to R5 adjacent to each other in the Y2-direction increases, and thus defects due to the film remainder may be prevented.

Other Embodiments

An embodiment has been shown in which the contact electrode 37 is formed using a polysilicon on the polysilicon film 24, but as the contact electrode 37, for example, a metal film such as a tungsten (W) film having a barrier film made of titanium nitride (TiN) may be used.

While certain embodiments have been described, these embodiments have been presented by way of example only, and are not intended to limit the scope of the inventions. Indeed, the novel devices and method described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:
1. A semiconductor memory device comprising:
a semiconductor substrate;
a first insulating film disposed on the semiconductor substrate;
a first conductive film disposed on the first insulating film;
a second insulating film disposed on the first conductive film;
a second conductive film disposed on the second insulating film;
a first electrode disposed on the first conductive film through an opening formed in the second conductive film and the second insulating film, and having a first width;
a second electrode that is formed on the first electrode and having a second width; and
a wiring layer that is formed on the second electrode, wherein a first width of the first electrode is wider than the second width of the second electrode.

2. The semiconductor memory device according to claim 1, further comprising:
a first spacer film that is formed between the second electrode and the second conductive film.

3. The semiconductor memory device according to claim 2, further comprising:
a second spacer film disposed between a side surface of the second electrode and a side surface of the first spacer film.

4. The semiconductor memory device according to claim 3,
wherein the second spacer film contacts an upper surface of the first electrode.

5. The semiconductor memory device according to claim 1,
wherein the first electrode comprises polysilicon.

6. The semiconductor memory device according to claim 1,
wherein the first spacer film comprises silicon nitride.

7. The semiconductor memory device according to claim 1, wherein the opening extends into the second electrode.

8. A semiconductor memory device comprising:
a semiconductor substrate;
a first insulating film disposed on the semiconductor substrate;
a first conductive film disposed on the first insulating film;
a second insulating film disposed on the first conductive film;
a second conductive film disposed on the second insulating film;
an electrode contacting the first conductive film through an opening formed in the second conductive film and the second insulating film;
a first spacer film disposed between the second conductive film and the electrode; and
a wiring layer that is formed on the electrode,
wherein the wiring layer is disposed along an upper side surface of the first spacer film, and has a width, in an upper end of the first spacer film, wider than a width of an upper surface of the electrode.

9. The semiconductor memory device according to claim 8,
wherein the wiring layer has a first lower surface that comes into contact with the electrode and a second lower surface that does not come into contact with the electrode, and
wherein at least a portion of the second lower surface of the wiring layer is positioned lower than the first lower surface of the wiring layer.

10. The semiconductor memory device according to claim 8,
wherein the wiring layer contacts an inner side wall of the first spacer film.

11. The semiconductor memory device according to claim 8, further comprising:
a second spacer film located between a side surface of the wiring layer and the upper side surface of the first spacer film.

12. The semiconductor memory device according to claim 11,
wherein the second spacer film contacts an upper surface of the electrode.

13. The semiconductor memory device according to claim 12, further comprising:
a peripheral transistor having a gate electrode comprising a stack of conductive films; and
a third spacer film along a side surface of the gate electrode of the peripheral transistor,
wherein a material of the third spacer film is the same as a material of the second spacer film.

14. The semiconductor memory device according to claim 8,
wherein the electrode contains a polysilicon.

15. The semiconductor memory device according to claim 8,
wherein the first spacer film contains a silicon nitride film.

16. The semiconductor memory device according to claim 8, further comprising:
a transistor that is provided with a gate electrode formed by stacking a plurality of conductive films,
wherein a position of the upper surface of the electrode is higher than a position of an upper surface of the gate electrode of the transistor.

* * * * *